(12) United States Patent
Oka et al.

(10) Patent No.: US 11,842,780 B2
(45) Date of Patent: Dec. 12, 2023

(54) SEMICONDUCTOR DEVICE AND ELECTRONIC APPARATUS INCLUDING THE SAME

(71) Applicant: Sony Semiconductor Solutions Corporation, Kanagawa (JP)

(72) Inventors: Mikio Oka, Kanagawa (JP); Yasuo Kanda, Kanagawa (JP); Kenji Noguchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 156 days.

(21) Appl. No.: 17/439,454

(22) PCT Filed: Jan. 31, 2020

(86) PCT No.: PCT/JP2020/003588
§ 371 (c)(1),
(2) Date: Sep. 15, 2021

(87) PCT Pub. No.: WO2020/195151
PCT Pub. Date: Oct. 1, 2020

(65) Prior Publication Data
US 2022/0157395 A1 May 19, 2022

(30) Foreign Application Priority Data
Mar. 22, 2019 (JP) ................ 2019-055290

(51) Int. Cl.
*G11C 17/16* (2006.01)
*G11C 17/06* (2006.01)
*G11C 17/18* (2006.01)

(52) U.S. Cl.
CPC .............. *G11C 17/06* (2013.01); *G11C 17/18* (2013.01)

(58) Field of Classification Search
CPC ................................ G11C 17/16; G11C 17/18
(Continued)

(56) References Cited

U.S. PATENT DOCUMENTS

2015/0262701 A1* 9/2015 Takizawa ............ G11C 11/1675
365/96
2017/0125665 A1* 5/2017 Yamada ................. H10B 61/22

FOREIGN PATENT DOCUMENTS

JP   2006-059919 A   3/2006
JP   2010-255774 A   10/2010
(Continued)

OTHER PUBLICATIONS

International Search Report issued in International Patent Application No. PCT/JP2020/003588 dated Mar. 24, 2020 and English translation of same. 5 pages.
(Continued)

*Primary Examiner* — Huan Hoang
(74) *Attorney, Agent, or Firm* — K&L Gates LLP

(57) ABSTRACT

A semiconductor device capable of efficiently increasing a capacity of a mounted storage element while achieving space saving, and an electronic apparatus including this semiconductor device are provided. The semiconductor device includes a storage element including a filament that has a first conductive layer, a second conductive layer, and an insulation layer. The first conductive layer and the second conductive layer are stacked with at least the insulation layer interposed between the first conductive layer and the second conductive layer. The filament obtains at least three identifiable resistance states by changing a combination of a state of the first conductive layer, a state of the second conductive layer, and a state of the insulation layer. The semiconductor device further includes a writing unit that produces the at
(Continued)

least three identifiable resistance states by applying a blow current to the storage element.

15 Claims, 16 Drawing Sheets

(58) Field of Classification Search
USPC .......................................................... 365/96
See application file for complete search history.

(56) References Cited

FOREIGN PATENT DOCUMENTS

| JP | 2011-225259 A | 11/2011 |
| JP | 2014-143284 A | 8/2014 |
| JP | 2015-534204 A | 11/2015 |

OTHER PUBLICATIONS

Written Opinion issued in International Patent Application No. PCT/JP2020/003588 dated Mar. 24, 2020. 6 pages.

* cited by examiner

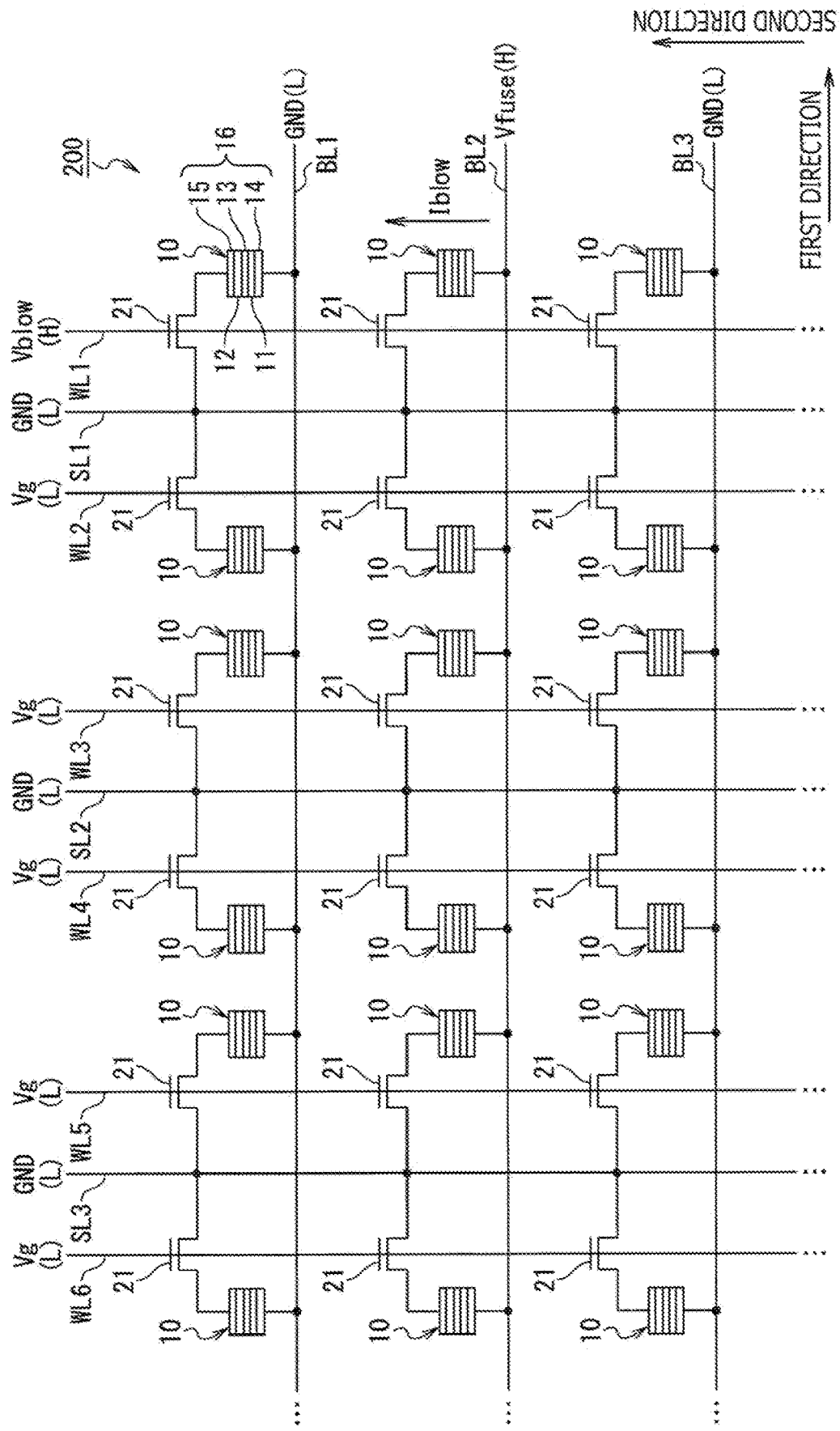

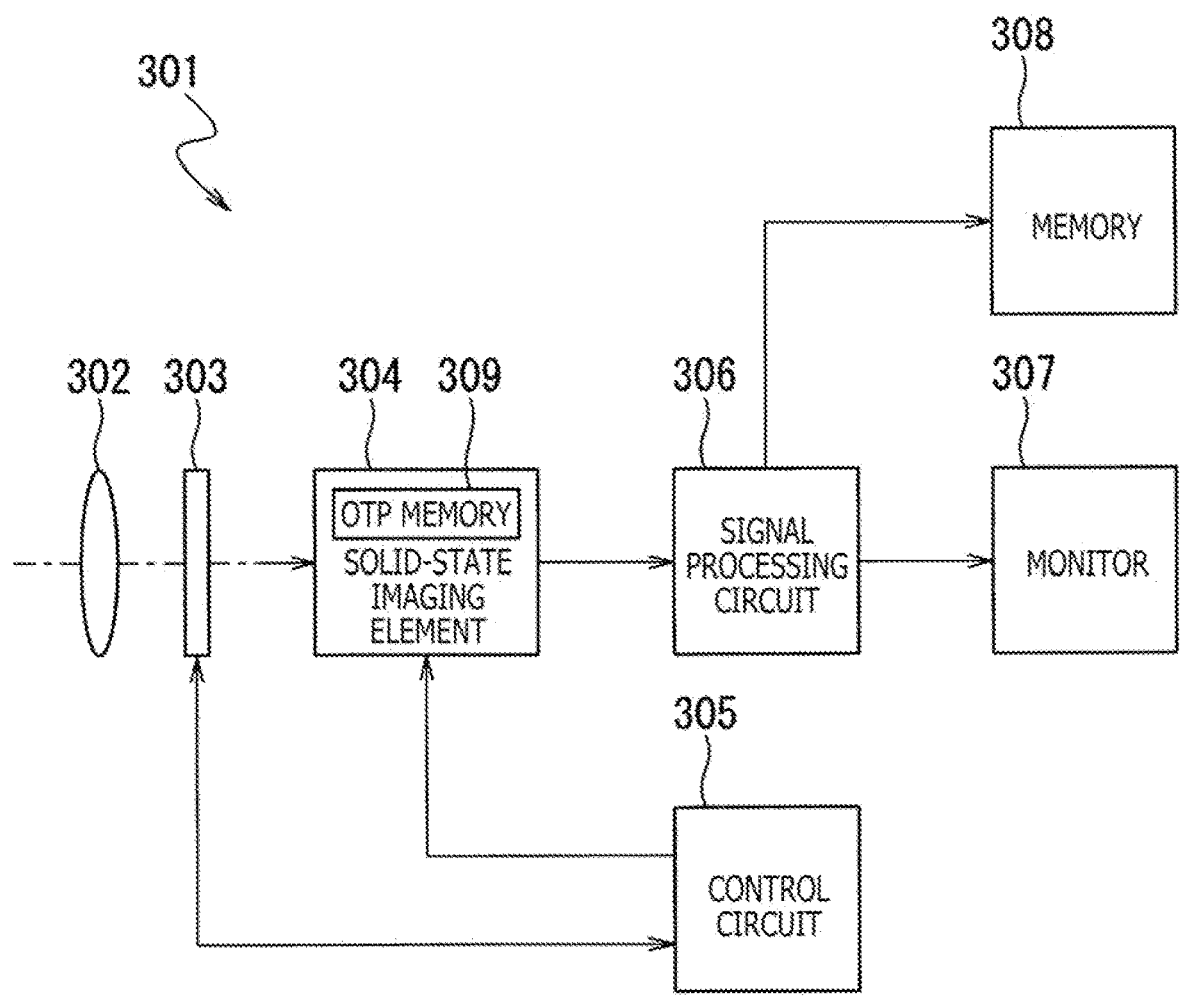

SEMICONDUCTOR DEVICE AND ELECTRONIC APPARATUS INCLUDING THE SAME

TECHNICAL FIELD

The present disclosure relates to a semiconductor device which includes a storage element capable of storing information by changing a resistance state, and an electronic apparatus including the semiconductor device.

BACKGROUND ART

An electric fuse having a function of an OTP (One Time Programmable) memory is conventionally mounted on a chip of a semiconductor integrated circuit or the like included in a semiconductor device. For example, the electric fuse is used as a trimming element for adjusting and correcting characteristics of the semiconductor device, such as performance and power consumption.

A conventional electric fuse causes salicide EM (Electro Migration) or Si melting in a filament of the electric fuse by supplying a predetermined current to the filament. In this manner, a resistance value of the filament is raised to write information to the electric fuse. For example, binary information is stored using "0" for an initial state and "1" for a state after a resistance value increase. The electric fuse using this type of filament requires a large current for cutting (breaking) the filament. In this case, a problem of a size increase of each memory cell may arise.

For solving this problem, there has been proposed an electric fuse which uses a magnetic tunnel junction (MTJ) element capable of breaking a filament by a smaller current than a current required for breaking a filament of a conventional electric fuse. For example, there has been disclosed a semiconductor device which has a writing mechanism achieving two types of writing methods, i.e., non-breaking and breaking, for bit cells included in a memory cell array of an MRAM (Magnetic Random Access Memory) which is a non-volatile memory using an MTJ element (see PTL 1).

CITATION LIST

Patent Literature

[PTL 1]
JP 2011-225259 A

SUMMARY

Technical Problem

The conventional technology of PTL 1 identified above is capable of reducing a transistor which applies a current necessary for cutting a filament, and therefore is capable of reducing a memory cell size according to the reduction of the transistor. However, there is still room for improvement in view of a capacity of each storage element.

The present disclosure has been developed in consideration of such circumstances. An object of the present disclosure is to provide a semiconductor device capable of efficiently increasing a capacity of a mounted storage element while achieving space saving, and an electronic apparatus including the semiconductor device.

Solution to Problem

A first aspect of the present disclosure is directed to a semiconductor device, or an electronic apparatus including the semiconductor device. The semiconductor device includes a storage element including a filament that has a first conductive layer, a second conductive layer, and an insulation layer. The first conductive layer and the second conductive layer are stacked with at least the insulation layer interposed between the first conductive layer and the second conductive layer. The filament obtains at least three identifiable resistance states by changing a combination of a state of the first conductive layer, a state of the second conductive layer, and a state of the insulation layer. The semiconductor device further includes a writing unit that produces the at least three identifiable resistance states by applying a blow current to the storage element.

A second aspect of the present disclosure is directed to a semiconductor device, or an electronic apparatus including the semiconductor device. The semiconductor device includes a plurality of word lines, a plurality of bit lines arranged in directions perpendicular to the plurality of word lines, and memory cells arranged at respective intersections of the plurality of word lines with the plurality of bit lines one memory cell for each intersection. Each of the memory cells includes a storage element including a filament that has a first conductive layer, a second conductive layer, and an insulation layer, the first conductive layer and the second conductive layer being stacked with at least the insulation layer interposed between the first conductive layer and the second conductive layer, the filament obtaining at least three identifiable resistance states by changing a combination of a state of the first conductive layer, a state of the second conductive layer, and a state of the insulation layer; and a transistor for blow that has a gate terminal connected to the corresponding word line and a drain terminal connected to the corresponding bit line. The semiconductor device further includes a writing unit that produces the at least three identifiable resistance states by applying a blow current to the filament by using the transistor.

BRIEF DESCRIPTION OF DRAWINGS

FIG. 17 is a diagram depicting a state of a memory cell array during information writing to a memory cell corresponding to a writing target.

FIG. 18 is a block diagram depicting a configuration example of an imaging device as an electronic apparatus to which the present technology is applicable.

DESCRIPTION OF EMBODIMENTS

Figure 1:
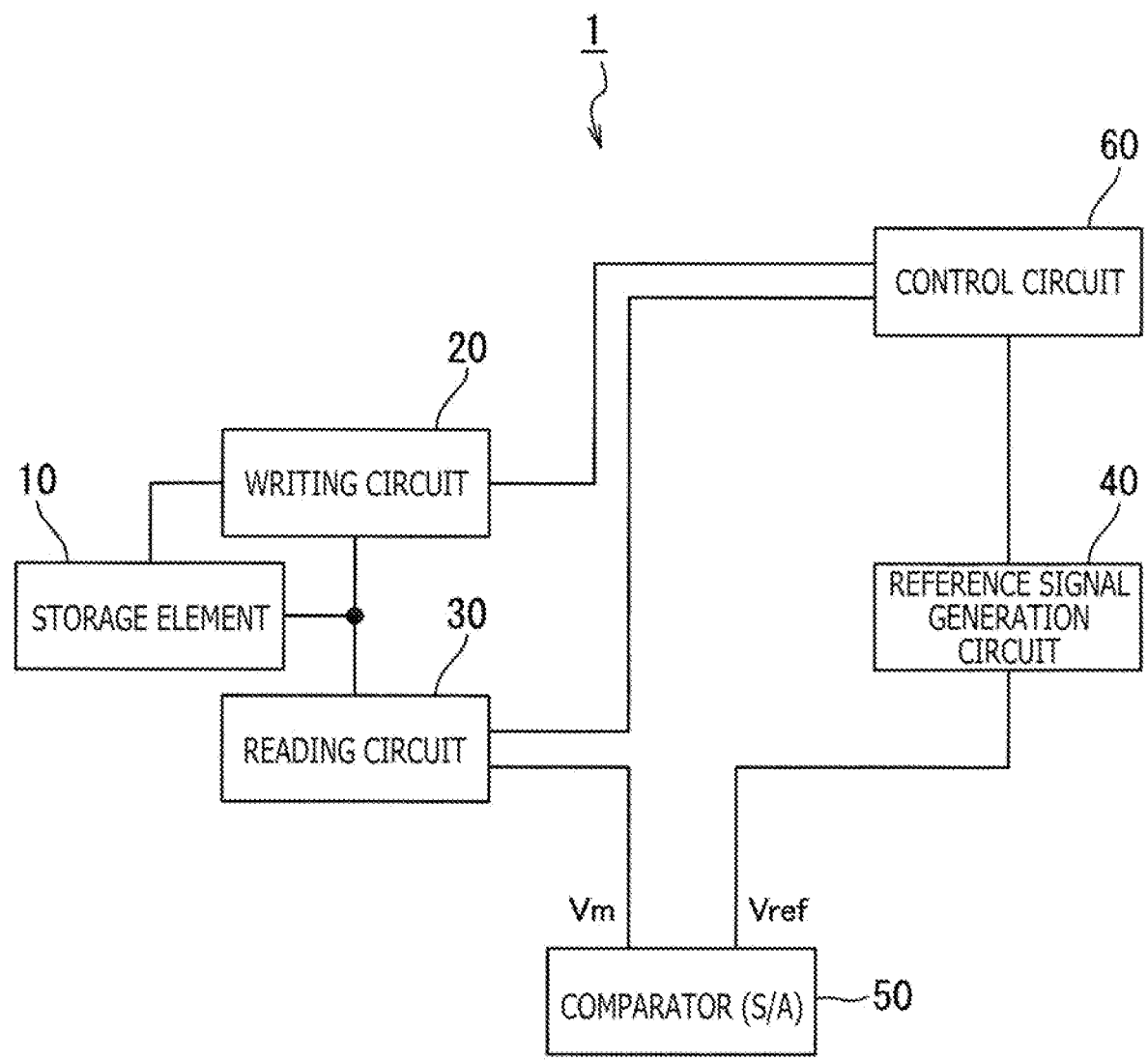
FIG. 1 is a block diagram depicting a configuration example of a semiconductor device 1 according to a first embodiment of the present disclosure.

Embodiments of the present disclosure will be hereinafter described with reference to the drawings. Identical or similar parts in the drawings referred to in the following description will be given identical or similar reference signs. However, it should be noted that the drawings are only schematic drawings, and that relations between thicknesses and planar sizes, thickness ratios of respective layers, and the like are therefore different from actual ones. Accordingly, specific thicknesses and sizes should be determined in the light of the following description. Moreover, needless to say, size relations and ratios of some drawings partially differ from those of other drawings.

Furthermore, a definition of directions such as an up-down direction in the following description is a definition only for convenience of explanation, and therefore does not limit a technical spirit of the present disclosure. For example, needless to say, the up-down direction is converted into a left-right direction to read a target observed after 90 degrees rotation, and is vertically inverted to read a target observed after 180 degrees rotation.

First Embodiment

[Configuration Example of Semiconductor Device of First Embodiment]

Before describing a configuration of a semiconductor device which includes a storage element having a function of an electric fuse according to a first embodiment of the present disclosure, initially briefly touched upon will be a problem which may arise from an increase in capacities of memory cells each including an electric fuse and mounted on a chip such as a semiconductor integrated circuit, for example.

For example, a method which increases the number of mounted memory cells (mounted capacities) is considered as a simple method for increasing capacities of memory cells mounted on a chip such as a semiconductor integrated circuit. However, each of the memory cells includes a transistor for cutting (breaking) a filament of an electric fuse (hereinafter also referred to as a "blow transistor"). Accordingly, when this method is used to increase the capacities of the memory cells mounted on the chip, an area occupied by the memory cells (particularly the blow transistors) on the chip increases. In this case, a chip size increases.

Accordingly, for increasing the capacities of the memory cells without increasing the chip size, considered first is a method which uses an element capable of breaking a filament using a smaller current than ever, such as a magnetic tunnel junction element, as a storage element constituting an electric fuse as in the invention according to PTL 1 described above. Moreover, considered second is a method which reduces the number of mounted memory cells by increasing capacities of respective storage elements using a configuration capable of storing more values.

Accordingly, proposed in the first embodiment will be a semiconductor device adopting the first method and the second method described above as one configuration example of a semiconductor device capable of solving the above problem.

Figure 2:
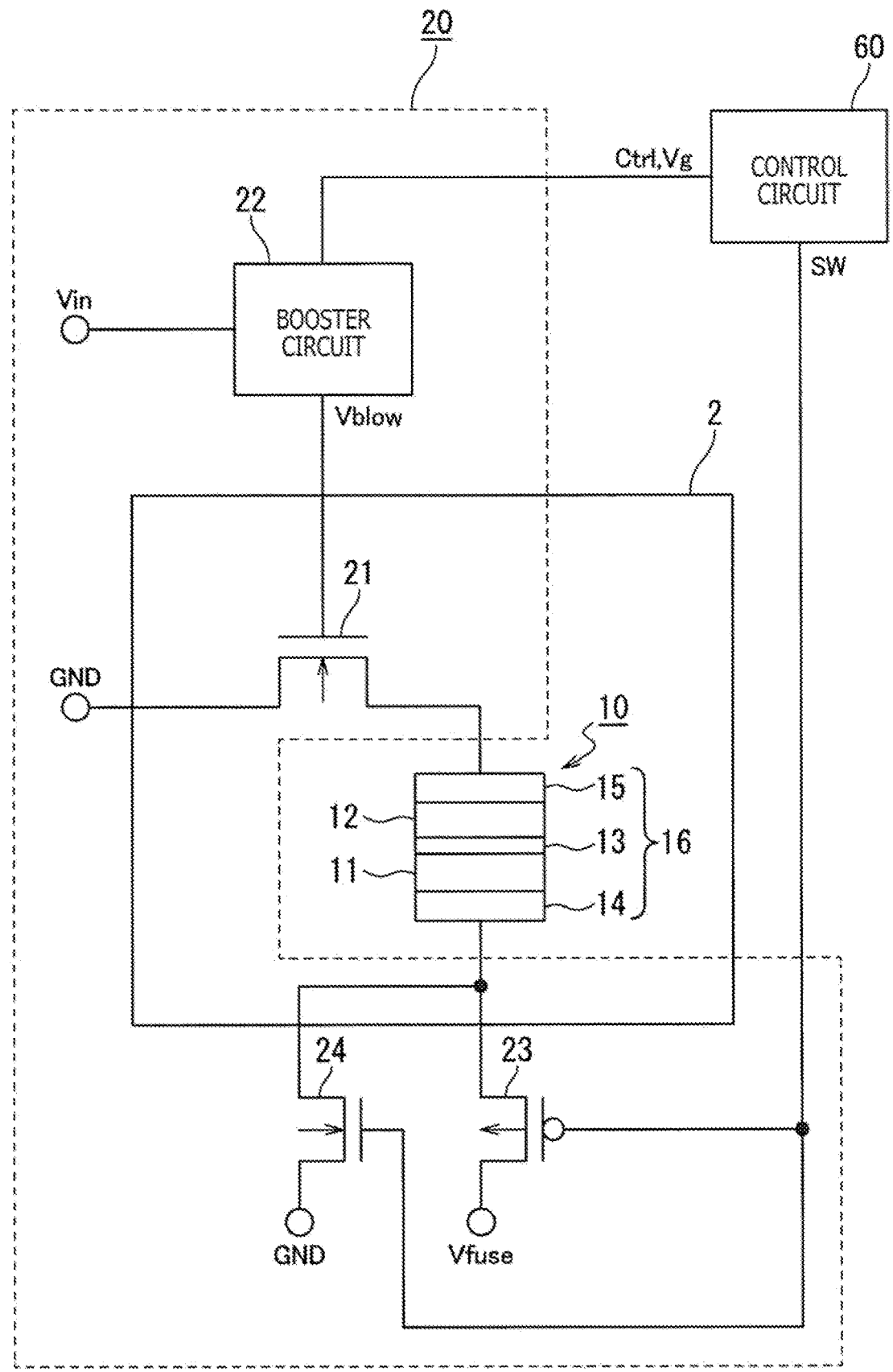
FIG. 2 is a circuit diagram depicting a configuration example of a storage element and a writing circuit according to the first embodiment.

FIG. 1 is a block diagram depicting a configuration example of a semiconductor device 1 according to the first embodiment of the present disclosure. Moreover, FIG. 2 is a diagram depicting a configuration example of a storage element and a writing circuit according to the first embodiment.

As depicted in FIG. 1, the semiconductor device 1 includes a storage element 10, a writing circuit 20, a reading circuit 30, a reference signal generation circuit 40, a comparator 50, and a control circuit 60.

[Configuration of Storage Element 10]

A configuration of the storage element 10 will be initially described.

The storage element 10 is constituted by a resistance change type storage element. It is assumed in the first embodiment that the storage element 10 is constituted by a magnetic tunnel junction element (MTJ element). Specifically, the storage element 10 of the first embodiment is constituted by a magnetic material having perpendicular magnetic anisotropy. As depicted in FIG. 2, the storage element 10 includes a storage layer 11 capable of changing a magnetization direction (also called a free layer, a recording layer, a magnetization reversal layer, a magnetization free layer, or a Magnetic Free Layer). Moreover, the storage element 10 includes a fixed magnetization layer 12 whose magnetization is fixed (also called a pin layer or a Magnetic Pinned Layer), and a tunnel barrier layer 13 (also called a tunnel insulation layer) formed between the storage layer 11 and the fixed magnetization layer 12. Furthermore, the storage element 10 includes an upper electrode 14 provided on the storage layer 11, and a lower electrode 15 provided on the fixed magnetization layer 12. The upper electrode 14 herein corresponds to a first conductive layer and a first electrode described in the claims, while the lower electrode 15 corresponds to a second conductive layer and a second electrode described in the claims.

In addition, for example, the storage layer 11 is constituted by a magnetic metal film containing cobalt (Co), iron (Fe), or others as a chief component. According to the first embodiment, the storage layer 11 is constituted by an alloy including Co, Fe, and boron (B) (hereinafter referred to as a "CoFeB alloy"), for example. The tunnel barrier layer 13 is constituted by magnesium oxide (MgO), aluminum oxide (AlO), or the like, for example. According to the first embodiment, the tunnel barrier layer 13 is constituted by MgO, for example. The fixed magnetization layer 12 is constituted by a magnetic metal film similar to that of the storage layer 11. Accordingly, the fixed magnetization layer 12 of the first embodiment is constituted by a CoFeB alloy, for example.

Moreover, for example, the upper electrode 14 and the lower electrode 15 are each constituted by tantalum (Ta), aluminum (Al), copper (Cu), tungsten (W), or the like. According to the first embodiment, the upper electrode 14 and the lower electrode 15 are each constituted by W, for example.

Note that the storage element 10 of the first embodiment is used as an electric fuse achieving multiple value recording for recording three or more values. Specifically, as depicted in FIG. 2, it is assumed that the tunnel barrier layer 13, the upper electrode 14, and the lower electrode 15 each constituting the storage element 10 form a filament 16. In addition, a current at a level sufficient for irreversibly changing a resistance state of the filament 16 by element breakage is applied to the storage element 10 by using the writing circuit 20. This writing action will be hereinafter also referred to as a "blow." In addition, a current causing this action will be referred to as a "blow current Iblow." In this manner, multiple value recording for recording three or more values is achieved by an irreversible change of the resistance state of the filament 16. Accordingly, the storage element 10 of the first embodiment is not required to have a configuration of an ordinary MTJ element, but may have other configurations as long as a similar function is achievable. For example, the storage layer 11 and the fixed magnetization layer 12 may be both configured as a fixed magnetization layer fixing a magnetization direction, or may be both configured as a storage layer capable of changing a magnetization direction. Note that a configuration not requiring a larger number of manufacturing steps is preferably adopted.

[Configuration of Writing Circuit 20]

A configuration of the writing circuit 20 will be subsequently described.

As depicted in FIG. 2, the writing circuit 20 includes a blow transistor 21, a booster circuit 22, a first writing switch element 23, and a second writing switch element 24. The writing circuit 20 herein corresponds to a writing unit described in the claims.

The blow transistor 21 is a transistor coming into an on-state according to a blow voltage Vblow applied to a gate terminal. The blow transistor 21 is connected to the storage element 10. According to the example depicted in FIG. 2, the blow transistor 21 is constituted by an NMOS-type FET. A source terminal of the blow transistor 21 is connected to a ground potential (GND). A drain terminal of the blow transistor 21 is connected to the lower electrode 15 of the storage element 10. A gate terminal of the blow transistor 21 is connected to an output terminal of the booster circuit 22.

The booster circuit 22 boosts an input voltage Vin according to a writing control signal Ctrl supplied from the control circuit 60 as an instruction of information writing, and generates a plurality of types of blow voltage Vblow. Then, the booster circuit 22 outputs (applies) the generated blow voltage Vblow to the blow transistor 21 to function as a variable output type booster circuit. Specifically, the booster circuit 22 generates a blow voltage Vblow having a voltage value corresponding to the instruction of the writing control signal Ctrl. The output terminal of the booster circuit 22 for outputting the blow voltage Vblow is connected to the gate terminal of the blow transistor 21. The blow voltage Vblow generated by the booster circuit 22 is input (applied) to the gate terminal of the blow transistor 21.

Moreover, the writing control signal Ctrl in a certain case indicates contents of an instruction for stopping output of the blow voltage Vblow. In the case of supply of this signal, the booster circuit 22 stops output of the blow voltage Vblow to the blow transistor 21.

The first writing switch element 23 is a switch element for switching between a connected state and a disconnected state between the upper electrode 14 of the storage element 10 and a power source supply terminal of a power source (hereinafter also referred to as a "power source Vfuse") of a power source voltage Vfuse. Note that the power source voltage Vfuse (hereinafter also referred to as a "writing voltage Vfuse") of the first embodiment is a constant voltage. The power source Vfuse is a power source capable of supplying the blow current Iblow at a level sufficient for producing a second state to a third state described below. For example, the first writing switch element 23 is constituted by a transistor. According to the example depicted in FIG. 2, the first writing switch element 23 is constituted by a PMOS-type FET. A gate terminal of the first writing switch element 23 is connected to a supply terminal of the control circuit 60 for supplying a control signal SW. A source terminal of the first writing switch element 23 is connected to the power source supply terminal of the power source Vfuse. A drain terminal of the first writing switch element 23 is connected to the upper electrode 14 of the storage element 10. Note that the first writing switch element 23 comes into an on-state when a low-level control signal SW is input to the gate terminal of the first writing switch element 23.

The second writing switch element 24 is a switch element for switching between a connected state and a disconnected state between the upper electrode 14 of the storage element 10 and the ground potential (GND). For example, the second writing switch element 24 is constituted by a transistor. According to the example depicted in FIG. 2, the second writing switch element 24 is constituted by an NMOS-type FET. A gate terminal of the second writing switch element 24 is connected to the supply terminal of the control circuit 60 for supplying a control signal SW. A source terminal of the second writing switch element 24 is connected to the ground potential (GND). A drain terminal of the second writing switch element 24 is connected to the upper electrode 14 of the storage element 10. Note that the second writing switch element 24 comes into an on-state when a high-level control signal SW is input to the gate terminal of the second writing switch element 24.

Accordingly, the second writing switch element 24 comes into an off-state during the on-state of the first writing switch element 23, and comes into the on-state during the off-state of the first writing switch element 23 to connect the upper electrode 14 to the ground potential.

[Configuration of Memory Cell 2]

Figure 3:
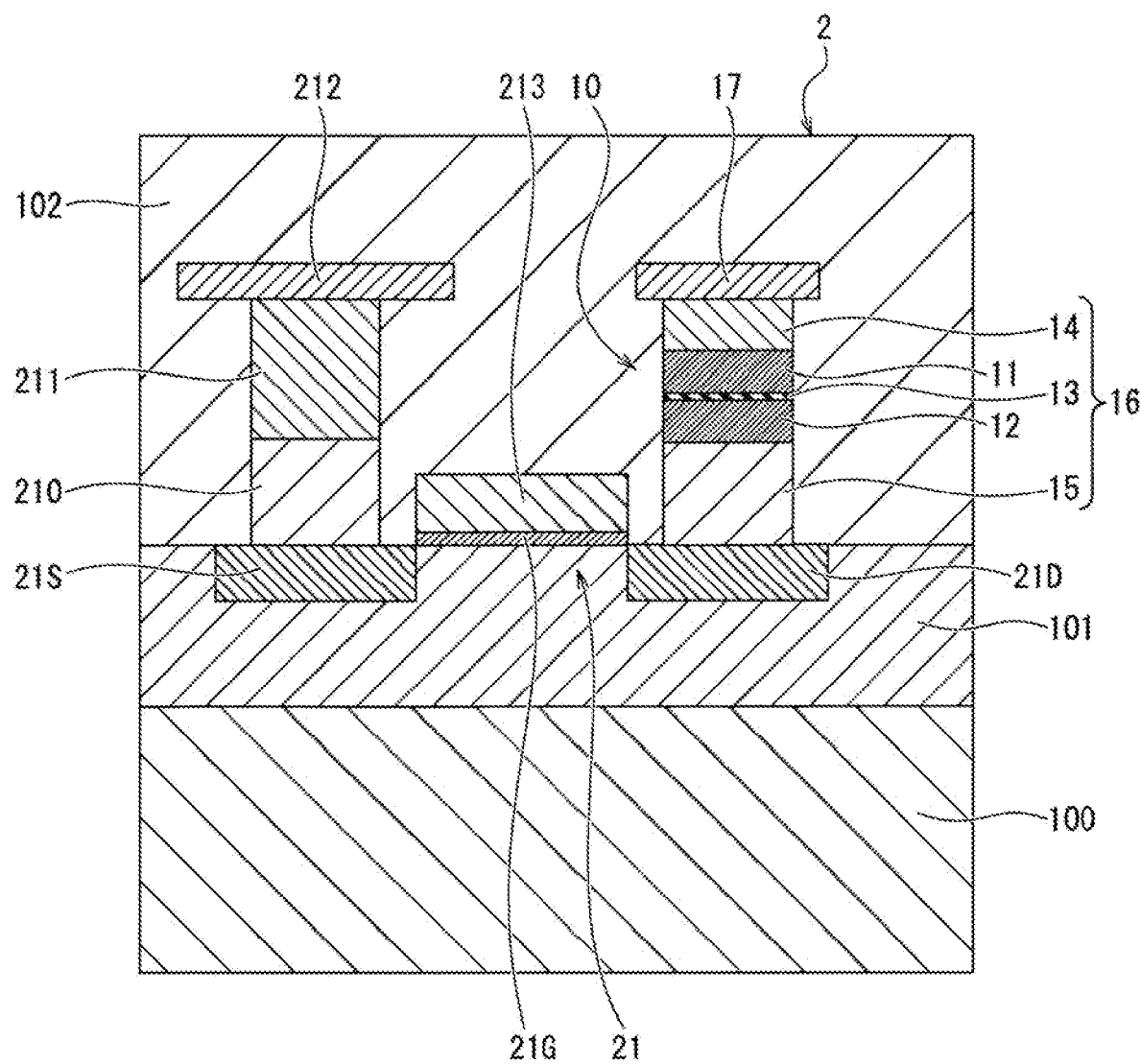
FIG. 3 is a cross-sectional diagram depicting a configuration example of a memory cell according to the first embodiment.

A specific configuration example of a memory cell 2, which is constituted by a set of the storage element 10 and the blow transistor 21 in FIG. 2, will be hereinafter described with reference to FIG. 3. FIG. 3 herein is a cross-sectional diagram depicting a configuration example of the memory cell according to the first embodiment.

As depicted in FIG. 3, the memory cell 2 includes a semiconductor substrate 100. The semiconductor substrate 100 is constituted by silicon. According to the example depicted in FIG. 3, the semiconductor substrate 100 is a P-type semiconductor substrate. A P-type well region 101, an interlayer dielectric 102, and the blow transistor 21 are provided on the semiconductor substrate 100. Specifically, the NMOS-type blow transistor 21 is provided in the P-type well region 101.

A gate electrode 21G is provided on the semiconductor substrate 100 with a gate insulation film (not depicted) interposed between the gate electrode 21G and the semiconductor substrate 100. A source region 21S is provided on one of sides between which the gate electrode 21G is sandwiched, while a drain region 21D is provided on the other side. In addition, the blow transistor 21 is constituted by the gate insulation film, the gate electrode 21G, the source region 21S, and the drain region 21D provided as above.

The storage element 10 and a metal wire 17 are disposed on the drain region 21D with the interlayer dielectric 102 interposed between the drain region 21D and the storage element 10 and the metal wire 17. Specifically, a contact constituting the lower electrode 15 is formed on the drain region 21D. A CoFeB alloy layer constituting the storage layer 11 is formed on this contact. In addition, an MgO layer constituting the tunnel barrier layer 13 is formed on this CoFeB alloy layer. A CoFeB alloy layer constituting the fixed magnetization layer 12 is formed on this MgO layer. Furthermore, a contact constituting the upper electrode 14 is formed on this CoFeB alloy layer. The metal wire 17 is formed on this contact.

Note that the storage element 10 according to the first embodiment has a bottom pin structure which forms the fixed magnetization layer 12 on the lower electrode 15, and forms the storage layer 11 on the fixed magnetization layer 12 with the tunnel barrier layer 13 interposed between the storage layer 11 and the fixed magnetization layer 12. The storage element 10 is not required to have this structure, but may have a top pin structure which forms the storage layer 11 on the lower electrode 15, and forms the fixed magnetization layer 12 on the storage layer 11 with the tunnel barrier layer 13 interposed between the fixed magnetization layer 12 and the storage layer 11.

On the other hand, contacts 210 and 211 and a metal wire 212 are disposed on the source region 21S with the interlayer dielectric 102 interposed between the source region 21S and the contacts 210 and 211 and the metal wire 212. Specifically, the contact 210 is formed on the source region 21S. The contact 211 is formed on the contact 210. The metal wire 212 is formed on the contact 211. Moreover, a metal wire 213 is disposed on the gate electrode 21G with the interlayer dielectric 102 interposed between the gate electrode 21G and the metal wire 213.

The interlayer dielectric 102 herein is a silicon oxide film (e.g., $SiO_2$ film, $SiO_2H$ film, or SiOCH film), or a silicon nitride film (e.g., SiN film or SiNH film). The interlayer dielectric 102 in one example is constituted by a silicon oxide film, for example. In addition, the metal wires 17, 212, and 213 are each constituted by Cu or gold (Au), for example. The metal wires 17, 212, and 213 in one example are each constituted by Cu, for example. In addition, the contacts 210 and 211 are each constituted by Ta, Al, Cu, W, or the like, for example. The contacts 210 and 211 in one example are each constituted by W, for example.

[Principle of Multiple Value Recording]

A principle of multiple value recording of the semiconductor device 1 will be subsequently described.

The semiconductor device 1 according to the first embodiment produces at least three identifiable resistance states of the filament 16 and performs multiple value recording while associating the respective resistance states with different information for each.

According to the present embodiment, information is recorded in the storage element 10 as multiple values by appropriately changing a blow condition for information writing by supply of a current to the storage element 10.

The blow transistor 21 comes into the on-state when the blow voltage Vblow is applied to the gate electrode 21G of the blow transistor 21. Accordingly, at the time of a blow (supply of the blow current Iblow) to the filament 16, the blow voltage Vblow is applied to the gate electrode 21G of the blow transistor 21. Note that the level of the blow current Iblow changes according to a potential difference between the gate electrode 21G of the blow transistor 21 and the source region 21S, i.e., the blow voltage Vblow applied to the gate electrode 21G in this example. Specifically, the blow current Iblow increases as the blow voltage Vblow becomes higher.

According to the first embodiment, therefore, conditions including a combination of a connection state with the power source Vfuse, a voltage value of the blow voltage Vblow applied to the gate electrode 21G of the blow transistor 21, and an application time of the blow voltage Vblow (hereinafter referred to as a blow time Tblow) are set as a blow condition.

A first blow condition of the first embodiment is constituted by connection between the power source Vfuse and the upper electrode 14, and application of a first blow voltage Vblow1 to the gate electrode 21G of the blow transistor 21 for a first blow time Tblow1. As a result, a first blow current Iblow1 at a level corresponding to a level of the first blow voltage Vblow1 flows in the storage element 10 for the first blow time Tblow1. The first blow voltage Vblow1 herein is set to a voltage causing a flow of the first blow current Iblow1 at a level necessary for breaking only the tunnel barrier layer 13 of the filament 16. In addition, the first blow time Tblow1 is set to a time length necessary for breaking only the tunnel barrier layer 13 by the first blow current Iblow1.

On the other hand, a second blow condition is constituted by connection between the power source Vfuse and the upper electrode 14, and application of a second blow voltage Vblow2 to the gate electrode 21G of the blow transistor 21 for a second blow time Tblow2. Note that the second blow voltage Vblow2 is set to a voltage higher than the first blow voltage Vblow1, and that the second blow time Tblow2 is set to a time longer than the first blow time Tblow1 in the first embodiment. In this manner, the second blow current Iblow2 larger than the first blow current Iblow1 is applied to the storage element 10 for the second blow time Tblow2 longer than the first blow time Tblow1.

The second blow voltage Vblow2 herein is set to a voltage causing a flow of the second blow current Iblow2 at a level necessary for breaking the upper electrode 14 and the lower electrode 15 of the filament 16. Moreover, the second blow time Tblow2 is set to a time length necessary for breaking the upper electrode 14 and the lower electrode 15 by the second blow current Iblow2. More specifically, the second blow voltage Vblow2 is set to a voltage higher than the first blow voltage Vblow1 of the first blow condition by 1[V] or higher, for example, while the second blow time Tblow2 (pulse width) is set to a time ten times longer than the first blow time Tblow1 or longer, for example. However, these conditions change according to the size or the material configuration of the element. Accordingly, it is preferable that not only these conditions but also other appropriate conditions are set according to the size and the material configuration of the element.

Furthermore, a third blow condition is constituted by non-application of the blow voltage Vblow to the gate electrode 21G of the blow transistor 21, and disconnection between the power source Vfuse and the upper electrode 14.

In addition, a common direction for supplying the blow current Iblow is defined in the first blow condition and the second blow condition. Specifically, one direction from the upper electrode 14 to the lower electrode 15 of the storage element 10 is defined.

It is assumed hereinafter that a resistance value R in the first state corresponding to an initial resistance state (prior to blow) of the filament 16 is a resistance value R0. Moreover, a resistance value R of the second state corresponding to a resistance state after breakage of only the tunnel barrier layer 13 in the first blow condition is a resistance value R1. Furthermore, a resistance value R of the third state corresponding to a resistance state after breakage of the upper electrode 14 and the lower electrode 15 in the second blow condition is a resistance value R2.

Figure 4:
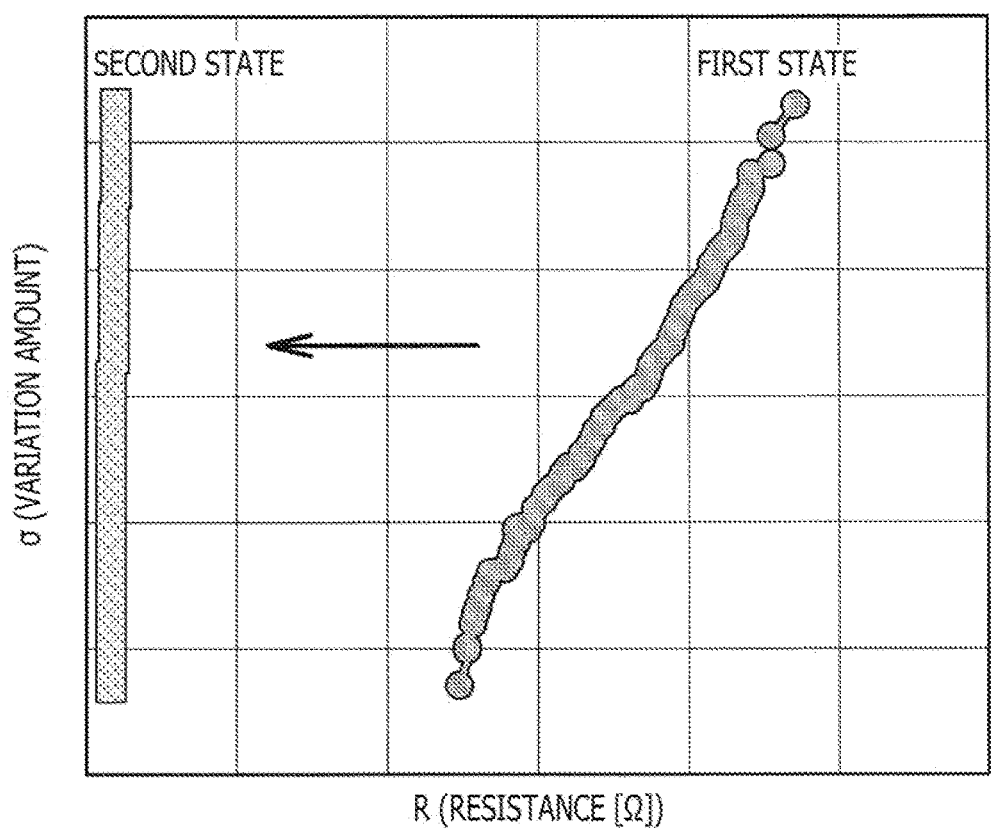
FIG. 4 is a diagram depicting an example of a change of a resistance value R of a filament 16 after supply of a first blow current Iblow1 to a storage element 10 in a first state (initial state prior to blow) in a first blow condition for a first blow time Tblow1.
Figure 5:
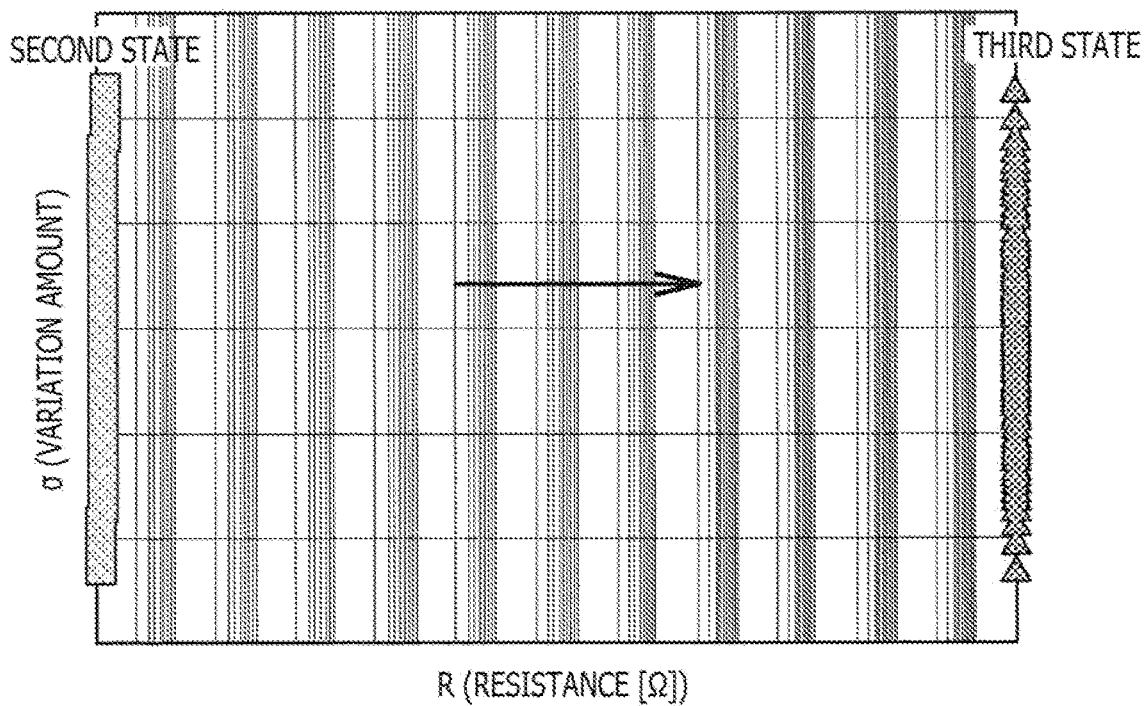
FIG. 5 is a diagram depicting an example of a change of the resistance value R of the filament 16 after supply of a second blow current Iblow2 to the storage element 10 in a second state in a second blow condition for a second blow time Tblow2.

FIG. 4 herein is a diagram depicting an example of a change of the resistance value R of the filament 16 after supply of the first blow current Iblow1 to the storage element 10 in the first state (initial state prior to blow) in the first blow condition for the first blow time Tblow1. Moreover, FIG. 5 is a diagram depicting an example of a change of the resistance value R of the filament 16 after supply of the second blow current Iblow2 to the storage element 10 in the second state in the second blow condition for the second blow time Tblow2. Furthermore, FIG. 6 is a diagram depicting a correspondence between a resistance state of the filament 16 and multiple value information.

Figure 6:
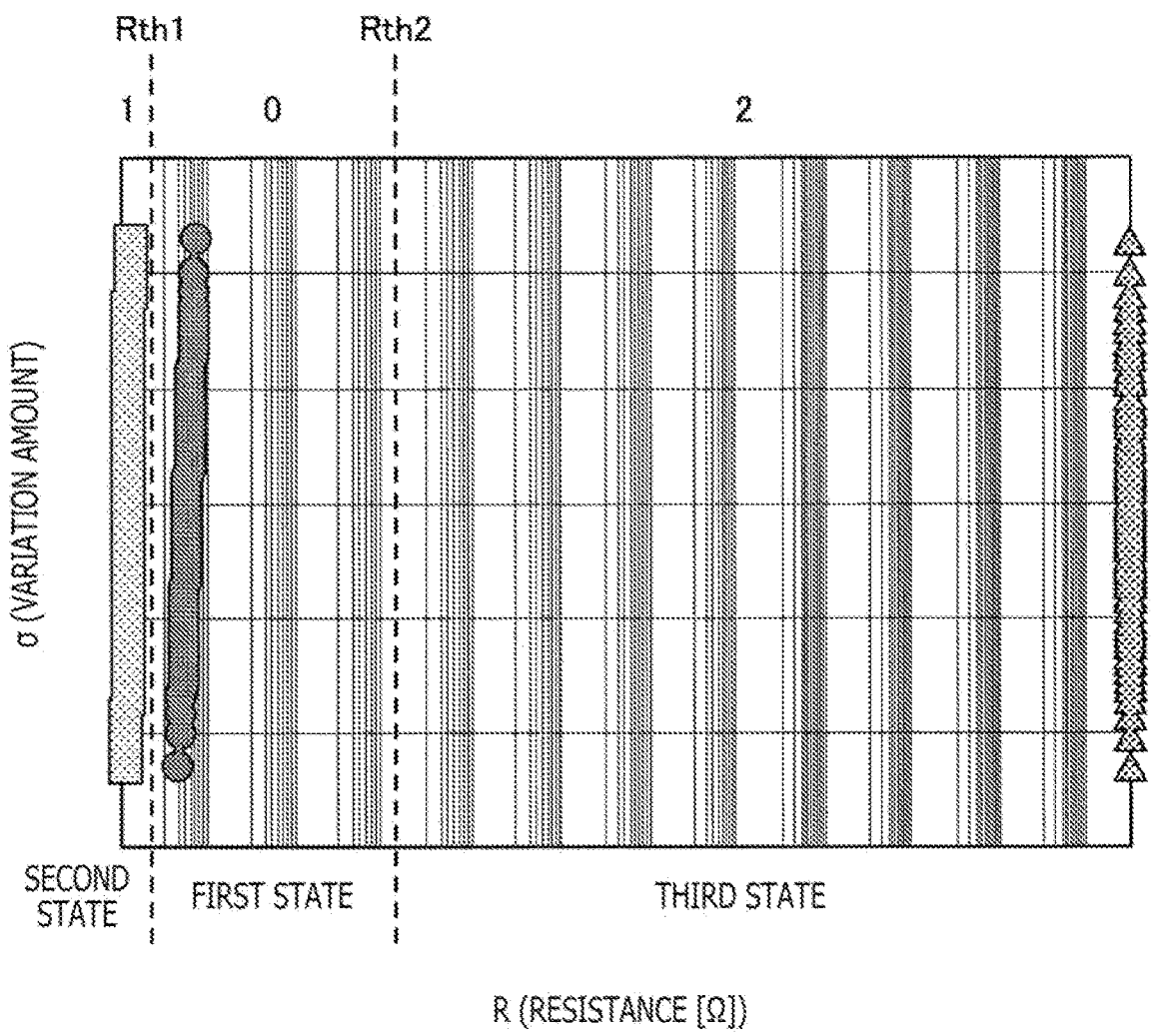
FIG. 6 is a diagram depicting an example of a correspondence between a resistance state of the filament 16 and multiple value information.

In each of FIGS. 4 to 6, a horizontal axis represents the resistance value R (logarithm) of the filament 16, and a vertical axis represents a variation amount δ of the resistance value R.

As depicted in FIG. 4, it is apparent that the resistance value R0 of the filament 16 has a variation in the first state corresponding to the initial state of the filament 16, for example. Subsequently, after the tunnel barrier layer 13 constituting the filament 16 is broken by the first blow current Iblow1 in the first state, the resistance state changes from the first state to the second state as depicted in FIG. 4. The tunnel barrier layer 13 is an insulation layer. Accordingly, the resistance value R changes from the resistance value R0 to the resistance value R1 (R1<R0) after breakage of the tunnel barrier layer 13. In other words, a state of a resistance value lower than that of the first state (low resistance state) is produced.

Subsequently, after the upper electrode 14 and the lower electrode 15 constituting the filament 16 are broken by the second blow current Iblow2 in the second state, the resistance state changes from the second state to the third state as depicted in FIG. 5. In this case, the electrodes are broken. Accordingly, the resistance value R considerably changes from the resistance value R1 to the resistance value R2 (R2>>R1). In other words, a state of a resistance value considerably higher than that of the second state (high resistance state) is produced. In addition, the third state is a state of a resistance value higher than that of the first state.

A resistance value difference between the first state and the second state is smaller than each of a resistance value difference between the first state and the third state and a resistance value difference between the second state and the third state, but has a value sufficient for distinction between the first state and the second state. According to the first embodiment, multiple value information recording is performed for the storage element 10 by using this property of the change characteristic of the resistance value R of the filament 16.

Specifically, according to the first embodiment, two thresholds (hereinafter referred to as a "first threshold Rth1" and a "second threshold Rth2") are set for the resistance value R of the filament 16 as depicted in FIG. 6. The first threshold Rth1 is set to a value between a resistance value (around R0) of the first state (state prior to blow) and a resistance value (around R1) of the second state of the filament 16 as depicted in FIG. 6. On the other hand, the second threshold Rth2 is set to a value between the resistance value (around R0) of the first state and a resistance value (around R2) of the third state. Note that the first threshold Rth1 and the second threshold Rth2 are each preferably set to a value absorbing a variation of the resistance value R0 of the first state.

For example, when the resistance value R of the filament 16 is a value between the first threshold Rth1 and the second threshold Rth2 as depicted in FIG. 6, the resistance state of the filament 16 at this time is associated with information "0" in the first embodiment. Moreover, when the resistance value R of the filament 16 is a value smaller than the first threshold Rth1, the resistance state of the filament 16 is associated with information "1." Furthermore, in a case where the resistance value R of the filament 16 is a value exceeding the second threshold Rth2, the resistance state of the filament 16 is associated with information "2."

Accordingly, when the state of the filament 16 is set to the first state (around resistance value R0), information recorded in the storage element 10 becomes "0." Moreover, when the state of the filament 16 is set to the second state (around resistance value R1), information recorded in the storage element 10 becomes "1." Furthermore, when the state of the filament 16 is set to the third state (around resistance value R2), information recorded in the storage element 10 becomes "2."

In this manner, according to the first embodiment, three value recording is achieved by setting the first to third states such that the first state is associated with information "0," that the second state is associated with information "1," and that the third state is associated with information "2."

[Configuration of Reading Circuit 30]

A configuration of the reading circuit 30 will be subsequently described. The reading circuit 30 herein corresponds to a reading unit described in the claims. In addition, FIG. 7 is a circuit diagram depicting a configuration example of the reading circuit.

Figure 7:
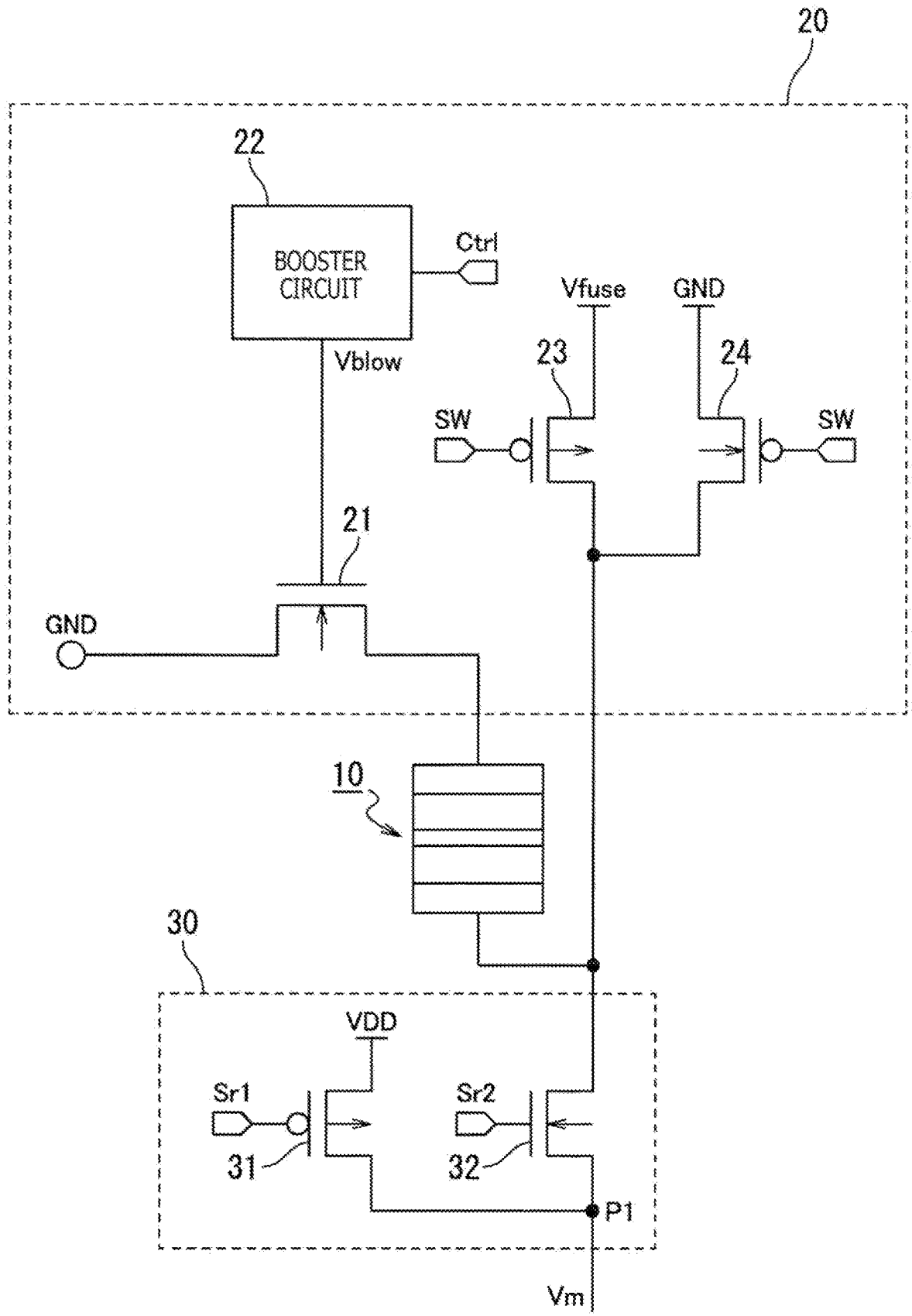
FIG. 7 is a circuit diagram depicting a configuration example of a reading circuit according to the first embodiment.

The reading circuit 30 is a circuit which reads (discriminates) information recorded in the storage element 10 as multiple values, and includes a first reading switch element 31 and a second reading switch element 32 as depicted in FIG. 7.

For example, the first reading switch element 31 and the second reading switch element 32 are each constituted by a transistor. According to the example depicted in FIG. 7, the first reading switch element 31 is constituted by a PMOS-type FET, while the second reading switch element 32 is constituted by an NMOS-type FET.

In this configuration, a gate terminal of the first reading switch element 31 is connected to an output terminal of the control circuit 60 for outputting a control signal Sr1, and a source terminal of the first reading switch element 31 is connected to a supply terminal of a power source voltage VDD. In addition, a drain terminal of the first reading switching element 31 is connected to a drain terminal of the second reading switch element 32 and one input terminal of a comparator 50. Note that the first reading switch element 31 comes into an on-state when a low-level control signal Sr1 is input to the gate terminal of the first reading switch element 31.

A gate terminal of the second reading switch element 32 is connected to an output terminal of the control circuit 60 for outputting a control signal Sr2. A source terminal of the second reading switch element 32 is connected to the drain terminals of the first writing switch element 23 and the second writing switch element 24 within the writing circuit 20, and to the upper electrode 14 of the storage element 10. In addition, a drain terminal of the second reading switching element 32 is connected to the drain terminal of the first reading switch element 31 and the one input terminal of the comparator 50. Note that the second reading switch element 32 comes into an on-state when a high-level control signal Sr2 is input to the gate terminal of the second reading switch element 32.

[Configuration of Reference Signal Generation Circuit 40]

Figure 8:
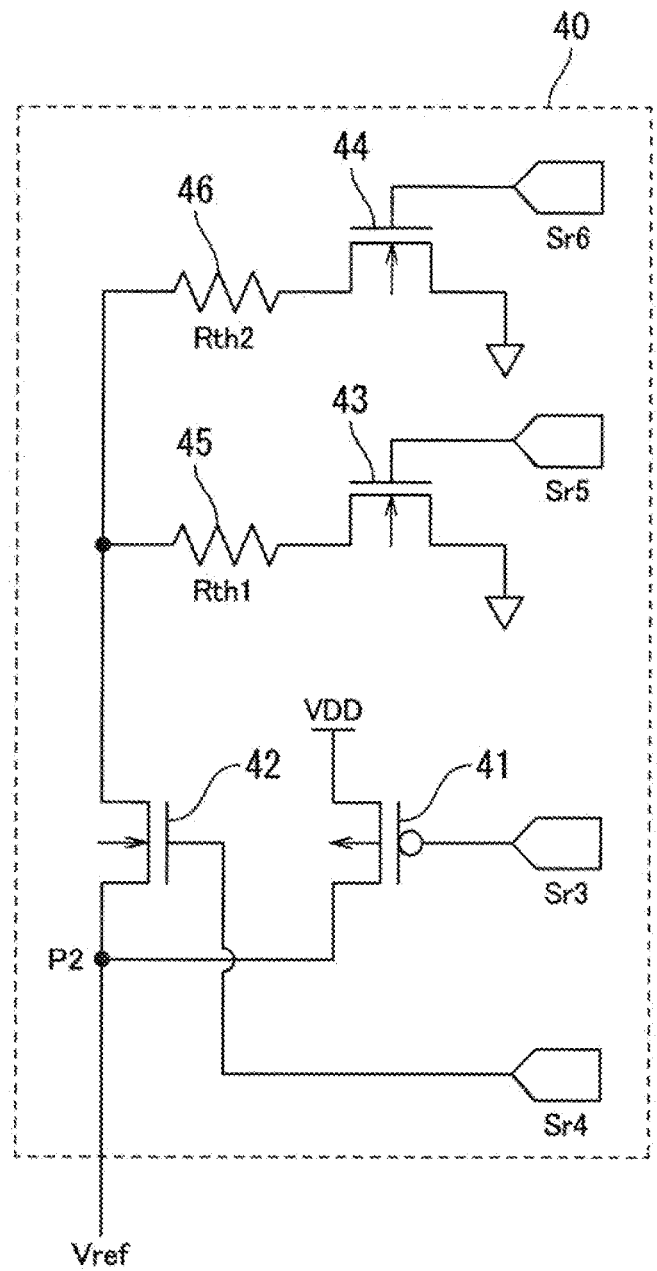
FIG. 8 is a circuit diagram depicting a configuration example of a reference signal generation circuit 40 according to the first embodiment.

A configuration of the reference signal generation circuit 40 will be subsequently described. The reference signal generation circuit 40 herein is a circuit which generates a reference signal (reference voltage signal) corresponding to a reference (threshold) at the time of reading of information recorded in the storage element 10 as multiple values. In addition, FIG. 8 is a circuit diagram depicting a configuration example of the reference signal generation circuit. Moreover, the reference signal generation circuit 40 herein corresponds to a threshold signal generation unit described in the claims.

As depicted in FIG. 8, the reference signal generation circuit 40 includes a first switch element 41, a second switch element 42, a third switch element 43, and a fourth switch element 44 as switch elements for generating reference signals. The reference signal generation circuit 40 further includes a first reference resistor 45 and a second reference resistor 46.

For example, each of the first to fourth switch elements 41 to 44 is constituted by a transistor. According to the example depicted in FIG. 8, the first switch element 41 is constituted by a PMOS-type FET, while each of the second to fourth switch elements 42 to 44 is constituted by an NMOS-type FET.

A gate terminal of the first switch element 41 thus configured is connected to an output terminal of the control circuit 60 for outputting a control signal Sr3, and a source terminal of the first switch element 41 is connected to a supply terminal of the power source voltage VDD. In addition, a drain terminal of the first switch element 41 is connected to a drain terminal of the second switch element 42 and the other input terminal of the comparator 50. Note that the first switch element 41 comes into an on-state when a low-level control signal Sr3 is input to the gate terminal of the first switch element 41.

A gate terminal of the second switch element 42 is connected to an output terminal of the control circuit 60 for outputting a control signal Sr4, and a source terminal of the second switch element 42 is connected to one terminal of each of the first reference resistor 45 and the second reference resistor 46. In addition, a drain terminal of the second switch element 42 is connected to the drain terminal of the first switch element 41 and the other input terminal of the comparator 50. Note that the second switch element 42 comes into an on-state when a high-level control signal Sr4 is input to the gate terminal of the second switch element 42.

A gate terminal of the third switch element 43 is connected to an output terminal of the control circuit 60 for outputting a control signal Sr5, a source terminal of the third switch element 43 is connected to the ground potential (GND), and a drain terminal of the third switch element 43 is connected to the other terminal of the first reference resistor 45. Note that the third switch element 43 comes into an on-state when a high-level control signal Sr5 is input to the gate terminal of the third switch element 43.

A gate terminal of the fourth switch element 44 is connected to an output terminal of the control circuit 60 for outputting a control signal Sr6, a source terminal of the fourth switch element 44 is connected to the ground potential (GND), and a drain terminal of the fourth switch element 44 is connected to the other terminal of the second reference resistor 46. Note that the fourth switch element 44 comes into an on-state when a high-level control signal Sr6 is input to the gate terminal of the fourth switch element 44.

The first reference resistor 45 is constituted by a resistor element which has a resistance value corresponding to the first threshold Rth1 described above with reference to FIG. 6 (the threshold for identifying "0" or "1" as information recorded in the storage element 10). On the other hand, the second reference resistor 46 is constituted by a resistor element which has a resistance value corresponding to the second threshold Rth2 described above with reference to FIG. 6 (the threshold for identifying "0" or "2" as information recorded in the storage element 10).

[Configuration of Comparator 50]

According to the first embodiment, the comparator 50 is constituted by a sense amplifier, for example. The comparator 50 herein corresponds to a discrimination unit described in the claims.

The one input terminal of the comparator 50 is connected to a connection point P1 (hereinafter referred to as a first connection point P1) between the drain terminal of the first reading switch element 31 and the drain terminal of the second reading switch element 32 within the reading circuit 30 depicted in FIG. 7. Moreover, the other input terminal of the comparator 50 is connected to a connection point P2 (hereinafter referred to as a second connection point P2) between the drain terminal of the first switch element 41 and the drain terminal of the second switch element 42 within the reference signal generation circuit 40.

The comparator 50 compares a voltage signal Vm obtained at the first connection point P1 and input to the one input terminal of the comparator 50 (a signal associated with the resistance value R of the filament 16), and a reference voltage signal Vref obtained at the second connection point P2 and input to the other input terminal of the comparator 50 (threshold signal), and outputs a comparison result.

[Configuration of Control Circuit 60]

According to the first embodiment, the control circuit 60 is a circuit for controlling operations of the writing circuit 20, the reading circuit 30, and the reference signal generation circuit 40 described above.

The control circuit 60 generates a writing control signal Ctrl for switching an output voltage (blow voltage Vblow) of the booster circuit 22, and outputs the generated writing control signal Ctrl to the booster circuit 22. In addition, the control circuit 60 generates a control signal SW for switching a connected state between the upper electrode 14 and the power source Vfuse, and a connected state between the upper electrode 14 and the ground potential, and outputs the generated control signal SW to the first and second writing switch elements 23 and 24. The control circuit 60 further includes a timer counter and counts an application time of the blow voltage Vblow to the blow transistor 21 by using the timer counter to control contents of the writing control signal Ctrl output to the booster circuit 22 and contents of the control signal SW output to the first and second writing switch elements 23 and 24 on the basis of the measured application time.

Specifically, at the time of information writing to the storage element 10, the control circuit 60 outputs, to the booster circuit 22, a writing control signal Ctrl indicating an instruction of a voltage value of the blow voltage Vblow set beforehand. In addition, the control circuit 60 outputs, to the first and second writing switch elements 23 and 24, a control signal SW for bringing the first writing switch element 23 into the on-state.

In this manner, both the blow transistor 21 and the first writing switch element 23 come into the on-state for a blow time Tblow set in the blow condition. As a result, the blow current Iblow at a level corresponding to a level of the blow voltage Vblow flows in the storage element 10 for the set blow time Tblow, and achieves information writing.

Moreover, the control circuit 60 outputs, to the booster circuit 22, a writing control signal Ctrl for stopping output of the blow voltage Vblow to the blow transistor 21 after an elapse of the blow time Tblow set beforehand. In addition, the control circuit 60 outputs, to the first and second writing switch elements 23 and 24, a control signal SW for bringing the second writing switch element 24 into the on-state. As a result, output of the blow voltage Vblow from the booster circuit 22 to the blow transistor 21 stops (a low-level signal Vg is applied to the gate electrode 21G instead of the blow voltage Vblow), and the upper electrode 14 is connected to the ground potential.

Moreover, at the time of reading of information from the storage element 10, the control circuit 60 outputs control signals Sr1 and Sr2 at signal levels set beforehand to the first reading switch element 31 and the second reading switch element 32 within the reading circuit 30. In this manner, a reading current Iread is supplied to the storage element 10. Note that the control circuit 60 controls the operation of the writing circuit 20 such that the blow transistor 21 and the first writing switch element 23 within the writing circuit 20 come into the on-state and the off-state, respectively, at the time of reading of information from the storage element 10 (at the time of discrimination of the resistance state of the filament 16).

On the other hand, at the time of reading of information from the storage element 10, the control circuit 60 outputs control signals Sr3 to Sr6 at signal levels set beforehand to the first to fourth switch elements 41 to 44 within the reference signal generation circuit 40, respectively. The control circuit 60 of the first embodiment performs a reading operation twice to allow a sequential comparison at the comparator 50 between the resistance R of the filament 16, the first reference resistor 45, and the second reference resistor 46. In the first reading operation, the combination of the signal levels of the control signals Sr3 to Sr6 is controlled such that a current flows in the first reference resistor 45. In the second reading operation, the combination of the signal levels of the control signals Sr3 to Sr6 is controlled such that a current flows in the second reference resistor 46. In this manner, the comparator 50 compares the magnitudes of the resistance R of the filament 16 and the first reference resistor 45 in the first reading operation, and compares the magnitudes of the resistance R and the second reference resistor 46 in the second reading operation. Information is read (values of the read information are determined) on the basis of these comparison results.

Note that described in the first embodiment has been the example where the various types of switch elements within the respective circuits of the semiconductor device 1 are each constituted by an MOS transistor. However, the present disclosure is not limited to this example. Any switch element can be used as long as it is a switch element capable of performing similar switch operation. Moreover, in a case where the various types of switch elements within the respective circuits are each constituted by an MOS transistor as in the present embodiment, the conductivity type (N type or P type) of the respective MOS transistors and the combination of these transistors may be changed as appropriate.

[Information Writing Operation to Storage Element 10]

Described next will be an operation for writing information to the storage element 10 by the writing circuit 20 of the first embodiment.

Figure 9:
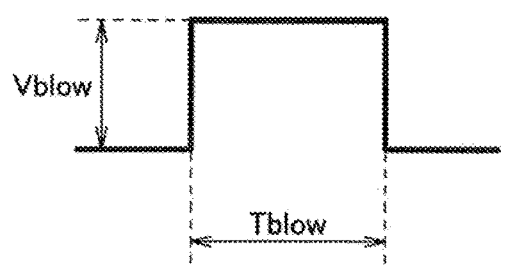
FIG. 9 a waveform diagram depicting a signal waveform example of a blow voltage Vblow applied to a blow transistor 21.

Initially, FIG. 9 depicts a signal waveform example of the blow voltage Vblow applied to the blow transistor 21. According to the first embodiment, the pulse-shaped blow voltage Vblow as depicted in FIG. 9 is applied to the gate electrode 21G of the blow transistor 21. In this case, the blow transistor 21 comes into the on-state during the blow time Tblow, and the blow current Iblow at a level corresponding to a level of the blow voltage Vblow is supplied to the filament 16 for the blow time Tblow.

Specifically, in a case where information "1" is recorded in the storage element 10 in the first state by using the writing circuit 20 depicted in FIG. 1, the first blow condition is set so as to produce the second state in the filament 16. The control circuit 60 supplies, to the booster circuit 22, a writing control signal Ctrl indicating contents of an instruction of applying the first blow voltage Vblow1 to the gate electrode 21G of the blow transistor 21 on the basis of the set first blow condition. Concurrently with supply of this signal, the control circuit 60 supplies, to the gate terminals of the first and second writing switch elements 23 and 24, a low-level control signal SW for connecting the power source Vfuse to the upper electrode 14. Moreover, the control circuit 60 starts measurement of the first blow time Tblow1 by using the timer counter. Accordingly, the first blow voltage Vblow1 is generated by the booster circuit 22. The generated first blow voltage Vblow1 is applied to the gate electrode 21G of the blow transistor 21, and the upper electrode 14 is connected to the power source Vfuse.

The control circuit 60 supplies, to the booster circuit 22, a writing control signal Ctrl indicating contents of an instruction of stopping output of the first blow voltage Vblow1 to the blow transistor 21 after an elapse of the first blow time Tblow1. Concurrently with supply of this signal, the control circuit 60 supplies, to the gate terminals of the first and second writing switch elements 23 and 24, a high-level control signal SW for connecting the upper electrode 14 to the ground potential. As a result, a low-level signal Vg is applied from the booster circuit 22 to the gate electrode 21G of the blow transistor 21, and the upper electrode 14 is connected to the ground potential. Specifically, the first blow current Iblow1 flows in the storage element 10 for the first blow time Tblow1. As a result, a blow (breakage) is given to the tunnel barrier layer 13 of the filament 16, and the filament 16 shifts to the second state where the resistance value R of the filament 16 becomes the resistance value R1.

In addition, in a case where information "2" is recorded in the storage element 10 in the first state or the second state by using the writing circuit 20, the second blow condition is set so as to produce the third state in the filament 16. The control circuit 60 supplies, to the booster circuit 22, a writing control signal Ctrl indicating contents of an instruction of applying the second blow voltage Vblow2 to the gate terminal of the blow transistor 21 on the basis of the set second blow condition. Concurrently with supply of this signal, the control circuit 60 supplies, to the gate terminals of the first and second writing switch elements 23 and 24, a low-level control signal SW for connecting the power source Vfuse to the upper electrode 14. Moreover, the control circuit 60 starts measurement of the second blow time Tblow2 by using the timer counter. Accordingly, the second blow voltage Vblow2 is generated by the booster circuit 22. The generated second blow voltage Vblow2 is applied to the gate electrode 21G of the blow transistor 21, and the upper electrode 14 is connected to the power source Vfuse.

The control circuit 60 supplies, to the booster circuit 22, a writing control signal Ctrl indicating contents of an instruction of stopping output of the second blow voltage Vblow2 to the blow transistor 21 after an elapse of the second blow time Tblow2. Concurrently with supply of this signal, the control circuit 60 supplies, to the gate terminals of the first and second writing switch elements 23 and 24, a high-level control signal SW for connecting the upper electrode 14 to the ground potential. Accordingly, a low-level signal Vg is applied from the booster circuit 22 to the gate electrode 21G of the blow transistor 21, and the upper electrode 14 is connected to the ground potential. Specifically, the second blow current Iblow2 flows in the storage element 10 for the second blow time Tblow2. As a result, a blow (breakage) is given to the upper electrode 14 and the lower electrode 15 of the filament 16, and the filament 16 shifts to the third state where the resistance value R of the filament 16 becomes the resistance value R2.

In addition, in a case where information "0" is recorded in the storage element 10, the filament 16 is kept in the initial state (first state) without receiving a blow (breakage). Specifically, the control circuit 60 outputs, to the booster circuit 22, a writing control signal Ctrl indicating contents of an instruction for stopping output of the blow voltage Vblow, and supplies, to the gate terminals of the first and second writing switch elements 23 and 24, a high-level control signal SW for connecting the upper electrode 14 to the ground potential. Accordingly, the booster circuit 22 of the first embodiment applies a low-level signal Vg to the gate electrode 21G of the blow transistor 21 instead of applying the blow voltage Vblow to the gate electrode 21G. In addition, the first writing switch element 23 comes into the off-state, while the second writing switch element 24 comes into the on-state. Therefore, the upper electrode 14 of the storage element 10 is connected to the ground potential. As a result, the filament 16 is maintained in the first state where the resistance value R of the filament 16 becomes the resistance value R0.

[Information Reading Operation from Storage Element 10]

Described next will be an operation for reading information from the storage element 10 by using the reading circuit 30, the reference signal generation circuit 40, and the comparator 50 according to the first embodiment.

Initially, the control circuit 60 outputs, to the booster circuit 22, a control signal indicating contents of an instruction for outputting a high-level signal which brings the blow transistor 21 within the writing circuit 20 into the on-state. In addition, the control circuit 60 inputs a high-level control signal SW to the gate terminals of the first writing switch element 23 and the second writing switch element 24. As a result, the blow transistor 21 comes into the on-state according to the high-level control signal applied to the gate electrode 21G of the blow transistor 21, and the upper electrode 14 of the storage element 10 comes into a state connected to the ground potential.

Subsequently, the control circuit 60 inputs a low-level control signal Sr1 to the gate terminal of the first reading switch element 31 within the reading circuit 30, and inputs a high-level control signal Sr2 to the gate terminal of the second reading switch element 32. Accordingly, not only the blow transistor 21 within the writing circuit 20, but also both the first reading switch element 31 and the second reading switch element 32 within the reading circuit 30 come into the on-state. As a result, the reading current Iread flows in the storage element 10.

On the other hand, as a first reading operation, the control circuit 60 initially outputs a low-level control signal Sr3 to the gate terminal of the first switch element 41, and outputs a high-level control signal Sr4 to the gate terminal of the second switch element 42. In addition, the control circuit 60 outputs a high-level control signal Sr5 to the gate terminal of the third switch element 43, and outputs a low-level control signal Sr6 to the gate terminal of the fourth switch element 44. Accordingly, each of the first to third switch elements 41 to 43 within the reference signal generation circuit 40 comes into the on-state, and the fourth switch element 44 comes into the off-state. As a result, a current flows in the first reference resistor 45 within the reference signal generation circuit 40.

Moreover, the comparator 50 compares a voltage signal Vm at the first connection point P1 within the reading circuit 30 and a reference voltage signal Vref at the second connection point P2 within the reference signal generation circuit 40 (hereinafter referred to as a "first comparison operation") in the state of a flow of a current at the first reference resistor 45.

Note that the potential (Vm) at the first connection point P1 becomes a potential corresponding to the resistance value R of the filament 16 in the state of the flow of the reading current Iread in the storage element 10 in the first comparison operation. Moreover, a potential (Vref) at the second connection point P2 becomes a potential corresponding to the resistance value (Rth1) of the first reference resistor 45 in the state of the flow of the current in the first reference resistor 45 in the first comparison operation. Accordingly, the first comparison operation performed by the comparator 50 between the voltage signal Vm and the reference voltage signal Vref is substantially equivalent to an operation for comparing the resistance value R of the storage element 10 and the resistance value of the first reference resistor 45, i.e., the first threshold Rth1.

The comparator 50 determines whether or not the voltage signal Vm at the first connection point P1 is lower than the reference voltage signal Vref at the second connection point P2 (Vm<Vref). Thereafter, in a case where the voltage signal Vm is lower than the reference voltage signal Vref (R<Rth1), the comparator 50 outputs a signal (comparison result) corresponding to information "1." After outputting this signal, the semiconductor device 1 ends the information reading operation. On the other hand, in a case where the comparator 50 determines that the voltage signal Vm is higher than the reference voltage signal Vref (R>Rth1), the semiconductor device 1 executes a second reading operation.

In the second reading operation, the control circuit 60 performs such control as to maintain the on-state of the first switch element 41 and the second switch element 42 within the reference signal generation circuit 40. In addition, the control circuit 60 inputs a low-level control signal Sr5 to the gate terminal of the third switch element 43 within the reference signal generation circuit 40, and inputs a high-level control signal Sr6 to the gate terminal of the fourth switch element 44. Accordingly, the first switch element 41, the second switch element 42, and the fourth switch element 44 within the reference signal generation circuit 40 each come into the on-state, and the third switch element 43 comes into the off-state. As a result, a current flows in the second reference resistor 46 within the reference signal generation circuit 40.

On the other hand, the comparator 50 compares a voltage signal Vm at the first connection point P1 within the reading circuit 30 and a reference voltage signal Vref at the second connection point P2 within the reference signal generation circuit 40 (hereinafter referred to as a "second comparison operation") in the state of a flow of a current at the second reference resistor 46.

Note that a potential (Vref) at the second connection point P2 becomes a potential corresponding to the resistance value (Rth2) of the second reference resistor 46 in the state of the flow of the current in the second reference resistor 46 in the second comparison operation. Accordingly, the second comparison operation performed by the comparator 50 between the voltage signal Vm and the reference voltage signal Vref is substantially equivalent to an operation for comparing the resistance value R of the storage element 10 and the resistance value of the second reference resistor 46, i.e., the second threshold Rth2.

The comparator 50 determines whether or not the voltage signal Vm at the first connection point P1 is lower than the reference voltage signal Vref at the second connection point P2 (Vm<Vref). Thereafter, in a case where the voltage signal Vm is lower than the reference voltage signal Vref (R<Rth2), the comparator 50 outputs a signal (comparison result) corresponding to information "0." After outputting this signal, the semiconductor device 1 ends the information reading operation.

On the other hand, in a case where the voltage signal Vm is higher than the reference voltage signal Vref (R>Rth2), the comparator 50 outputs a signal (comparison result) corresponding to information "2." After outputting this signal, the semiconductor device 1 ends the information reading operation.

According to the first embodiment, multiple value information recorded in the storage element 10 is read in the manner described above. Note that the method for reading information from the storage element 10 in the first embodiment is not limited to the example described above. Any method may be used as the method for reading information from the storage element 10 as long as it is a method capable of identifying the resistance state of the filament 16 by using two thresholds. For example, in the first embodiment, the first comparison operation which supplies a current to the first reference resistor 45 is carried out first, and then the second comparison operation which supplies a current to the second reference resistor 46 is performed. However, this order of the comparison operations may be reversed.

[Electric Fuse Information Rewriting Method]

The semiconductor device 1 of the first embodiment is capable of setting the resistance state of the filament 16 to any one of the three states (first state, second state, and third state) by changing the blow condition of the storage element 10 as described above. Accordingly, the second state (low resistance state) of the filament 16 is changeable to the third state (high resistance state) by again giving a blow to the filament 16. According to the first embodiment, therefore, not only multiple value recording of information, but also rewriting of information is achievable for the storage element 10.

According to the first embodiment, the filament 16 is initially brought into the second state (low resistance state) by a first blow for the storage element 10 to record information "1" in the storage element 10. In this manner, a state of the storage element 10 prior to rewriting of information is produced.

In this state, the semiconductor device 1 uses the first threshold Rth1 as a threshold for distinction between information "0" and information "1" similarly to the reading process for reading information recorded as multiple values described above.

Subsequently, a blow (second) is again given to the storage element 10 in the first state to change the state of the filament 16 to the third state (high resistance state). In this manner, a state of the storage element 10 after rewriting of information is produced.

In this state, the semiconductor device 1 subsequently changes the first threshold Rth1, which is the threshold for distinction between information "0" and information "1," to the second threshold Rth2. Specifically, after rewriting of information, the semiconductor device 1 changes the threshold of the comparator 50 to make distinction that the resistance state (second state) of the filament 16 prior to rewriting (after first blow) corresponds to information "0."

According to the present embodiment, rewriting of information can be performed for the storage element 10 in the manner described above. Note that a part of a plurality of the storage elements 10 mounted on a chip such as a semiconductor integrated circuit in the present embodiment may be used as electric fuses dedicated for multiple value recording, and that the remaining part may be used as electric fuses dedicated for rewriting, for example.

Operations and Effects of First Embodiment

The semiconductor device 1 according to the first embodiment includes the storage element 10 which includes the filament 16 having the upper electrode 14, the lower electrode 15, and the tunnel barrier layer 13. The upper electrode 14 and the lower electrode 15 are stacked with at least the tunnel barrier layer 13 interposed between the upper electrode 14 and the lower electrode 15. The filament 16 which obtains at least three identifiable resistance states (the first through third states in the first embodiment) by changing a combination of the states of the upper electrode 14 and the lower electrode 15 and the state of the tunnel barrier layer 13. Moreover, the writing circuit 20 produces the at least three identifiable resistance states by applying the blow current Iblow to the storage element 10 via the blow transistor 21. Furthermore, the reading circuit 30 reads a signal associated with a resistance value of the storage element 10, and the reference signal generation circuit 40 generates a reference signal (threshold signal) for discriminating the at least three identifiable resistance states. In addition, the comparator 50 compares the reference signal generated by the reference signal generation circuit 40 and the signal associated with the resistance value read by the reading circuit 30 to discriminate the at least three resistance states.

Besides, the storage element 10 is constituted by a magnetic tunnel junction element (MTJ element) which includes the fixed magnetization layer 12, the upper electrode 14 provided on the fixed magnetization layer 12, the storage layer 11, the lower electrode 15 provided on the storage layer 11, and the tunnel barrier layer 13 provided between the fixed magnetization layer 12 and the storage layer 11. Accordingly, the filament 16 includes the upper electrode 14, the lower electrode 15, and the tunnel barrier layer 13, and obtains at least three identifiable resistance states by changing a combination of the resistance states of these.

Moreover, the semiconductor device 1 is configured to produce the at least three identifiable resistance states constituted by the first state corresponding to an initial state prior to application of the blow current Iblow, the second state produced after damaging the tunnel barrier layer 13 by application of the blow current Iblow, and the third state produced after damaging the upper electrode 14 and the lower electrode 15 by application of the blow current Iblow.

Note that the second state is a low resistance state corresponding to a resistance lower than that of the first state, while the third state is a high resistance state corresponding to a resistance higher than the first state.

Moreover, the blow conditions of the filament 16 are established to produce the first to third states described above. Specifically, the first blow condition is set as a condition for applying the first blow voltage Vblow 1 to the gate electrode 21G of the blow transistor 21 for the first blow time Tblow1. Moreover, the second blow condition is set as a condition for applying the second blow voltage Vblow2 higher than the first blow voltage Vblow1 to the gate electrode 21G for the second blow time Tblow2 longer than the first blow time Tblow1. Furthermore, the third blow condition is set as a condition for maintaining the first state without applying the first blow voltage Vblow1 to the gate electrode 21G.

In this configuration, the storage element 10 is constituted by the MTJ element. Accordingly, the blow current Iblow required at the time of information writing can be reduced, so that the size of the blow transistor 21 can be reduced similarly to a conventional blow transistor. In addition, multiple values can be recorded as information in the one storage element 10. Accordingly, the cell size per one piece of information can be more reduced in comparison with a conventional configuration only allowed to record binary information. In other words, each capacity of the memory cells can be more increased without enlarging an area for mounting the respective memory cells in comparison with a conventional configuration for recording binary information.

Moreover, multiple value recording of information thus achieved can reduce areas of peripheral circuits such as a decoder.

Furthermore, the semiconductor device 1 can be manufactured by processes similar to conventional processes. Accordingly, the necessity of changing processes or adding new processes is eliminated. A cost increase produced by a process change is therefore avoidable.

In addition, the semiconductor device 1 according to the first embodiment further sets, for the first blow condition and the second blow condition, such a condition designating one direction from the upper electrode 14 to the lower electrode 15 as the flow direction of the blow current Iblow.

According to this configuration, the blow current Iblow flows in one direction from the upper electrode 14 to the lower electrode 15, or from the lower electrode 15 to the upper electrode 14. Accordingly, one side of a diffusion region of the blow transistor 21 is connectable to a fixed potential in the case of a configuration of a memory cell array, for example. This configuration allows sharing of the diffusion region by adjoining memory cells, and therefore achieves simplification of a circuit configuration. As a result, a layout area can be reduced at the time of array formation, for example.

Modification 1 of First Embodiment

Described in the above first embodiment has been a configuration which controls the level of the blow current Iblow by changing the level of the blow voltage Vblow applied to the gate electrode 21G of the blow transistor 21 by using the booster circuit 22. Modification 1 of the first embodiment is different from the first embodiment in a point that the level of the blow current Iblow is controlled by changing the level of the writing voltage Vfuse applied to the upper electrode 14 by using a booster circuit 26.

[Configuration of Semiconductor Device 1A According to Modification 1 of First Embodiment]

Figure 10:
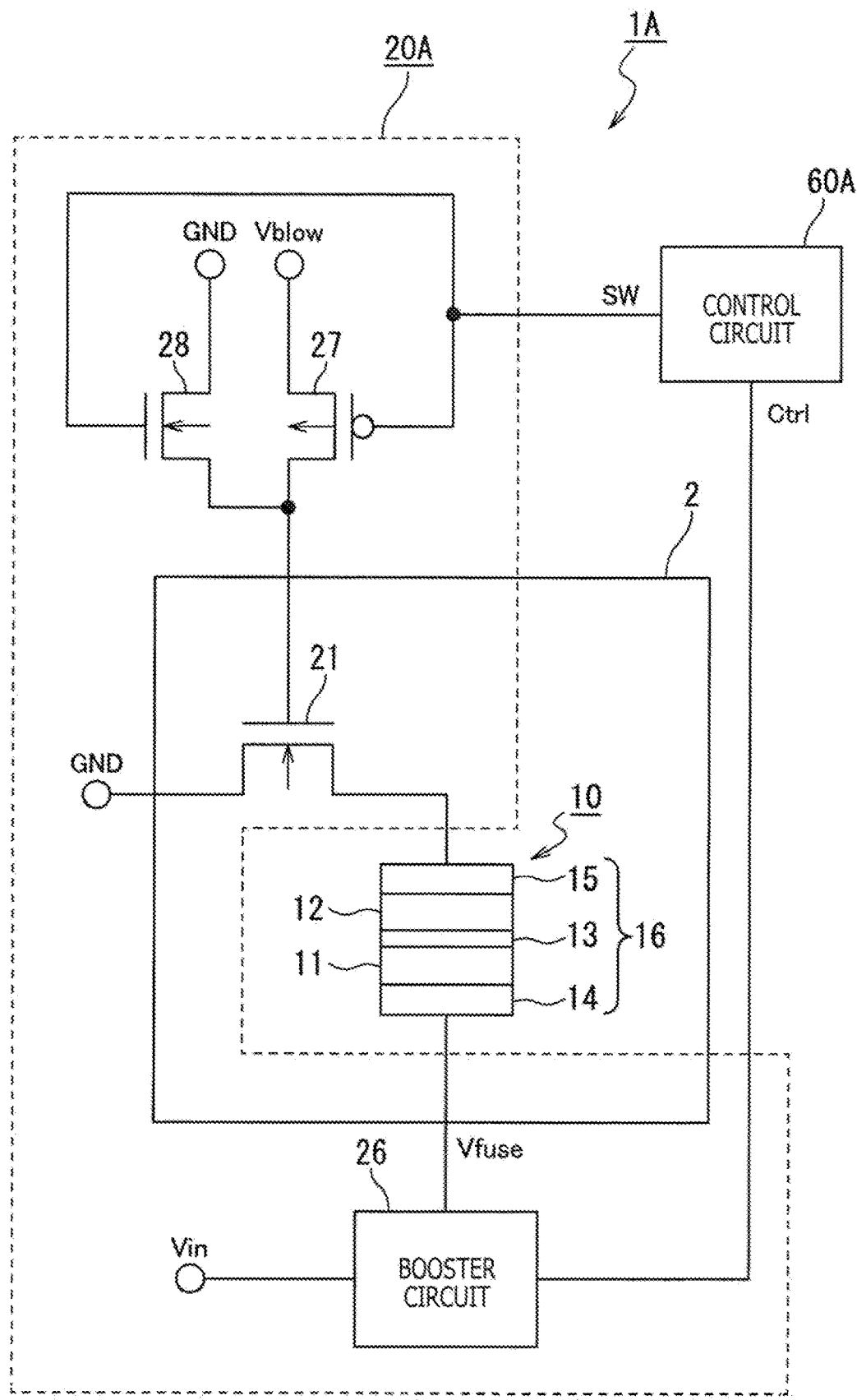
FIG. 10 is a circuit diagram depicting a configuration example of a part including a writing circuit and a control circuit of a semiconductor device according to modification 1 of the first embodiment.

FIG. 10 herein is a circuit diagram depicting a configuration example of a part including a writing circuit and a control circuit of a semiconductor device according to modification 1 of the first embodiment.

For example, as depicted in FIG. 10, a semiconductor device 1A according to the present modification 1 includes a writing circuit 20A and a control circuit 60A instead of the writing circuit 20 and the control circuit 60 included in the semiconductor device 1 of the first embodiment described above.

[Configuration of Writing Circuit 20A According to Modification 1 of First Embodiment]

The writing circuit 20A according to the present modification 1 includes the blow transistor 21, the booster circuit 26, a third writing switch element 27, and a fourth writing switch element 28.

The booster circuit 26 boosts the input voltage Vin according to the writing control signal Ctrl supplied from the control circuit 60A as an instruction of information writing to generate a plurality of types of writing voltage Vfuse. Then, the booster circuit 26 outputs (applies) the generated writing voltage Vfuse to the storage element 10 to function as a variable output type booster circuit. Specifically, the booster circuit 26 generates the writing voltage Vfuse having a voltage value corresponding to instruction contents according to the contents of the instruction of the writing control signal Ctrl. An output terminal of the booster circuit 26 for outputting the writing voltage Vfuse is connected to the upper electrode 14 of the storage element 10. The writing voltage Vfuse generated by the booster circuit 26 is applied to the upper electrode 14. According to the present modification 1, therefore, the role of the blow voltage Vblow of the first embodiment described above is played by the writing voltage Vfuse by controlling the level of the blow current Iblow according to a change of the writing voltage Vfuse.

Moreover, the writing control signal Ctrl in a certain case indicates contents of an instruction for stopping output of the writing voltage Vfuse. In the case of supply of this signal, the booster circuit 26 stops output of the writing voltage Vfuse to the upper electrode 14.

The third writing switch element 27 is a switch element for switching between a connected state and a disconnected state between the gate electrode 21G of the blow transistor 21 and a power source supply terminal of a power source (hereinafter also referred to as a "power source Vblow") of a power source voltage Vblow. Note that the power source voltage Vblow of the present modification 1 is a constant voltage. The power source voltage Vblow is a voltage capable of bringing the blow transistor 21 into the on-state so as to supply, to the storage element 10, the blow current Iblow at a level necessary for changing the resistance state of the filament 16 from the second state to the third state. For example, the third writing switch element 27 is constituted by a transistor. According to the example depicted in FIG.

10, the third writing switch element 27 is constituted by a PMOS-type FET. In this configuration, a gate terminal of the third writing switch element 27 is connected to a supply terminal of the control circuit 60 for supplying a control signal SW. A source terminal of the third writing switch element 27 is connected to the power source supply terminal of the power source Vblow. A drain terminal of the third writing switch element 27 is connected to the gate terminal (gate electrode 21G) of the blow transistor 21. Note that the third writing switch element 27 comes into an on-state when a low-level control signal SW is input to the gate terminal of the third writing switch element 27.

The fourth writing switch element 28 is a switch element for switching between a connected state and a disconnected state between the gate terminal of the blow transistor 21 and the ground potential (GND). For example, the fourth writing switch element 28 is constituted by a transistor. According to the example depicted in FIG. 10, the fourth writing switch element 28 is constituted by an NMOS-type FET. In this configuration, a gate terminal of the fourth writing switch element 28 is connected to a supply terminal of the control circuit 60 for supplying a control signal SW. A source terminal of the fourth writing switch element 28 is connected to the ground potential (GND). A drain terminal of the fourth writing switch element 28 is connected to the gate terminal of the blow transistor 21. Note that the fourth writing switch element 28 comes into an on-state when a high-level control signal SW is input to the gate terminal of the fourth writing switch element 28.

Accordingly, the fourth writing switch element 28 comes into an off-state during the on-state of the third writing switch element 27, and comes into the on-state during the off-state of the third writing switch element 27 to connect the gate terminal of the blow transistor 21 to the ground potential.

[Blow Condition of Modification 1 of First Embodiment]

The present modification 1 establishes, as blow conditions, conditions containing a combination of a connected state of the power source Vblow, a voltage value of the writing voltage Vfuse applied to the upper electrode 14 of the storage element 10, and an application time of the writing voltage Vfuse (hereinafter referred to as s blow time Tblow as well).

A fourth blow condition according to the present modification 1 is constituted by connection of the power source Vblow to the gate terminal of the blow transistor 21, and application of a first writing voltage Vfuse1 to the upper electrode 14 of the storage element 10 for the first blow time Tblow1. As a result, the first blow current Iblow1 at a level corresponding to a level of the first writing voltage Vfuse1 flows in the storage element 10 for the first blow time Tblow1. The first writing voltage Vfuse1 herein is set to a voltage causing a flow of the first blow current Iblow1 in the storage element 10 at a current level necessary for breaking only the tunnel barrier layer 13 of the filament 16. In addition, the first blow time Tblow1 is set to a time length necessary for breaking only the tunnel barrier layer 13 by the first blow current Iblow1.

On the other hand, a fifth blow condition according to the present modification 1 is constituted by connection between the power source Vblow and the gate terminal of the blow transistor 21, and application of a second writing voltage Vfuse2 to the upper electrode 14 of the storage element 10 for the second blow time Tblow2. Note that the second writing voltage Vfuse2 is set to a voltage higher than the first writing voltage Vfuse1, and that the second blow time Tblow2 is set to a time longer than the first blow time Tblow1. In this manner, the second blow current Iblow2 larger than the first blow current Iblow1 is applied to the storage element 10 for the second blow time Tblow2 longer than the first blow time Tblow1.

The second writing voltage Vfuse2 herein is set to a voltage causing a flow of the second blow current Iblow2 in the storage element 10 at a current level necessary for breaking the upper electrode 14 and the lower electrode 15 of the filament 16. Moreover, the second blow time Tblow2 is set to a time length necessary for breaking the upper electrode 14 and the lower electrode 15 by the second blow current Iblow2.

Furthermore, a sixth blow condition according to the present modification 1 is constituted by disconnection between the power source Vblow and the gate terminal of the blow transistor 21 without application of the writing voltage Vfuse to the upper electrode 14 of the storage element 10.

[Configuration of Control Circuit 60A of Modification 1 of First Embodiment]

The control circuit 60A according to the present modification 1 generates a writing control signal Ctrl for switching an output voltage (writing voltage Vfuse) of the booster circuit 26, and outputs the generated writing control signal Ctrl to the booster circuit 26. Moreover, the control circuit 60A generates a control signal SW for switching a connected state between the gate terminal of the blow transistor 21 and the power source Vblow, and a connected state between the gate terminal of the blow transistor 21 and the ground potential. The control circuit 60A subsequently outputs the generated control signal SW to the third and fourth writing switch elements 27 and 28. Furthermore, the control circuit 60A includes a timer counter, and counts an application time of the writing voltage Vfuse to the upper electrode 14 by using the timer counter to control contents of the writing control signal Ctrl output to the booster circuit 26 and contents of the control signal SW output to the third and fourth writing switch elements 27 and 28 on the basis of the measured application time.

Specifically, at the time of information writing to the storage element 10, the control circuit 60A outputs, to the booster circuit 26, a writing control signal Ctrl indicating a voltage value of the writing voltage Vfuse set beforehand. In addition, the control circuit 60A outputs a control signal SW for bringing the third writing switch element 27 into the on-state to the third and fourth writing switch elements 27 and 28.

As a result, the blow transistor 21 comes into the on-state, and the writing voltage Vfuse is applied to the upper electrode 14 for the blow time Tblow set in the blow condition. As a result, the blow current Iblow at a level corresponding to a level of the writing voltage Vfuse flows in the storage element 10 for the set blow time Tblow, and achieves information writing.

Moreover, the control circuit 60A outputs, to the booster circuit 22, a writing control signal Ctrl for stopping output of the writing voltage Vfuse to the upper electrode 14 after an elapse of the blow time Tblow set beforehand. In addition, the control circuit 60A outputs the control signal SW for bringing the fourth writing switch element 28 into the on-state to the third and fourth writing switch elements 27 and 28. As a result, output of the writing voltage Vfuse from the booster circuit 26 to the upper electrode 14 is stopped, and the gate terminal of the blow transistor 21 is connected to the ground potential.

[Information Writing Operation to Storage Element 10 in Modification 1 of First Embodiment]

Described next will be an operation for writing information to the storage element 10 by the writing circuit 20A according to the present modification 1.

Specifically, in a case where information "1" is recorded in the storage element 10 in the first state by using the writing circuit 20 depicted in FIG. 10, the fourth blow condition is set so as to produce the second state in the filament 16. The control circuit 60 supplies, to the booster circuit 26, a writing control signal Ctrl for applying the first writing voltage Vfuse1 to the upper electrode 14 of the storage element 10 on the basis of the set fourth blow condition. Concurrently with supply of this signal, the control circuit 60 supplies, to the gate terminals of the third and fourth writing switch elements 27 and 28, a low-level control signal SW for connecting the power source Vblow to the gate terminal of the blow transistor 21. Moreover, the control circuit 60 starts measurement of the first blow time Tblow1 by using the timer counter. Accordingly, the first writing voltage Vfuse1 is generated by the booster circuit 26. In addition, the generated first writing voltage Vfuse1 is applied to the upper electrode 14 of the storage element 10, and the gate terminal of the blow transistor 21 is connected to the power source Vblow.

The control circuit 60 supplies, to the booster circuit 26, a writing control signal Ctrl for stopping output of the first writing voltage Vfuse1 to the upper electrode 14 after an elapse of the first blow time Tblow1. Concurrently with supply of this signal, the control circuit 60 supplies, to the gate terminals of the third and fourth writing switch elements 27 and 28, a high-level control signal SW for connecting the gate terminal of the blow transistor 21 to the ground potential. Accordingly, a low-level signal is applied from the booster circuit 26 to the upper electrode 14 of the storage element 10, and the gate terminal of the blow transistor 21 is connected to the ground potential. Accordingly, the first blow current Iblow1 flows in the storage element 10 for the first blow time Tblow1. As a result, a blow (breakage) is given to the tunnel barrier layer 13 of the filament 16, and the filament 16 shifts to the second state where the resistance value R of the filament 16 becomes the resistance value R1.

In addition, in a case where information "2" is recorded in the storage element 10 in the first state or the second state by using the writing circuit 20A, the fifth blow condition is set so as to produce the third state in the filament 16. The control circuit 60 supplies, to the booster circuit 26, a writing control signal Ctrl for applying the second writing voltage Vfuse2 to the upper electrode 14 of the storage element 10 on the basis of the set fifth blow condition. Concurrently with supply of this signal, the control circuit 60 supplies, to the gate terminals of the third and fourth writing switch elements 27 and 28, a low-level control signal SW for connecting the power source Vblow to the gate terminal of the blow transistor 21. Moreover, the control circuit 60 starts measurement of the second blow time Tblow2 by using the timer counter. Accordingly, the second writing voltage Vfuse2 is generated by the booster circuit 26. In addition, the generated second writing voltage Vfuse2 is applied to the upper electrode 14 of the storage element 10, and the gate terminal of the blow transistor 21 is connected to the power source Vblow.

The control circuit 60 supplies, to the booster circuit 26, a writing control signal Ctrl for stopping output of the second writing voltage Vfuse2 to the upper electrode 14 after an elapse of the second blow time Tblow2. Concurrently with supply of this signal, the control circuit 60 supplies, to the gate terminals of the third and fourth writing switch elements 27 and 28, a high-level control signal SW for connecting the gate terminal of the blow transistor 21 to the ground potential. Accordingly, a low-level signal is applied from the booster circuit 26 to the upper electrode 14 of the storage element 10, and the gate terminal of the blow transistor 21 is connected to the ground potential. Accordingly, the second blow current Iblow2 flows in the storage element 10 for the second blow time Tblow2. As a result, a blow (breakage) is given to the upper electrode 14 and the lower electrode 15 of the filament 16, and the filament 16 shifts to the third state where the resistance value R of the filament 16 becomes the resistance value R2.

In addition, in a case where information "0" is recorded in the storage element 10, the filament 16 is kept in the initial state (first state) without receiving a blow (breakage). Specifically, the control circuit 60 outputs, to the booster circuit 26, a writing control signal Ctrl indicating contents of an instruction for stopping output of the writing voltage Vfuse. In addition, the control circuit 60 supplies, to the gate terminals of the third and fourth writing switch elements 27 and 28, a high-level control signal SW for connecting the gate terminal of the blow transistor 21 to the ground potential. Accordingly, the booster circuit 26 of the present modification 1 applies a low-level signal to the upper electrode 14 instead of applying the writing voltage Vfuse to the upper electrode 14. Moreover, the third writing switch element 27 comes into the off-state, while the fourth writing switch element 28 comes into the on-state. In addition, the gate terminal of the blow transistor 21 is connected to the ground potential. As a result, the filament 16 is maintained in the first state where the resistance value R of the filament 16 becomes the resistance value R0.

Operations and Effects of Modification 1 of First Embodiment

According to the semiconductor device 1A of the present modification 1, the writing circuit 20A controls the level of the blow current Iblow by changing the writing voltage Vfuse applied to the upper electrode 14 of the storage element 10 according to the control signal Ctrl issued from the control circuit 60A.

This configuration achieves operations and effects similar to those of the first embodiment described above.

Second Embodiment

Described above in the first embodiment has been the configuration of the semiconductor device 1 including the single memory cell 2. A second embodiment is different from the first embodiment in a point that a semiconductor device 1B includes a memory cell array having a structure where a plurality of the memory cells 2, each of which is a single memory cell depicted in FIG. 2 and described in the first embodiment, are provided in an array arrangement.

Configuration parts similar to corresponding configuration parts of the first embodiment described above will be hereinafter given similar reference signs to omit repetitive explanation as appropriate, and only different points will be described in detail.

[Configuration of Semiconductor Device 1B]

Figure 11:
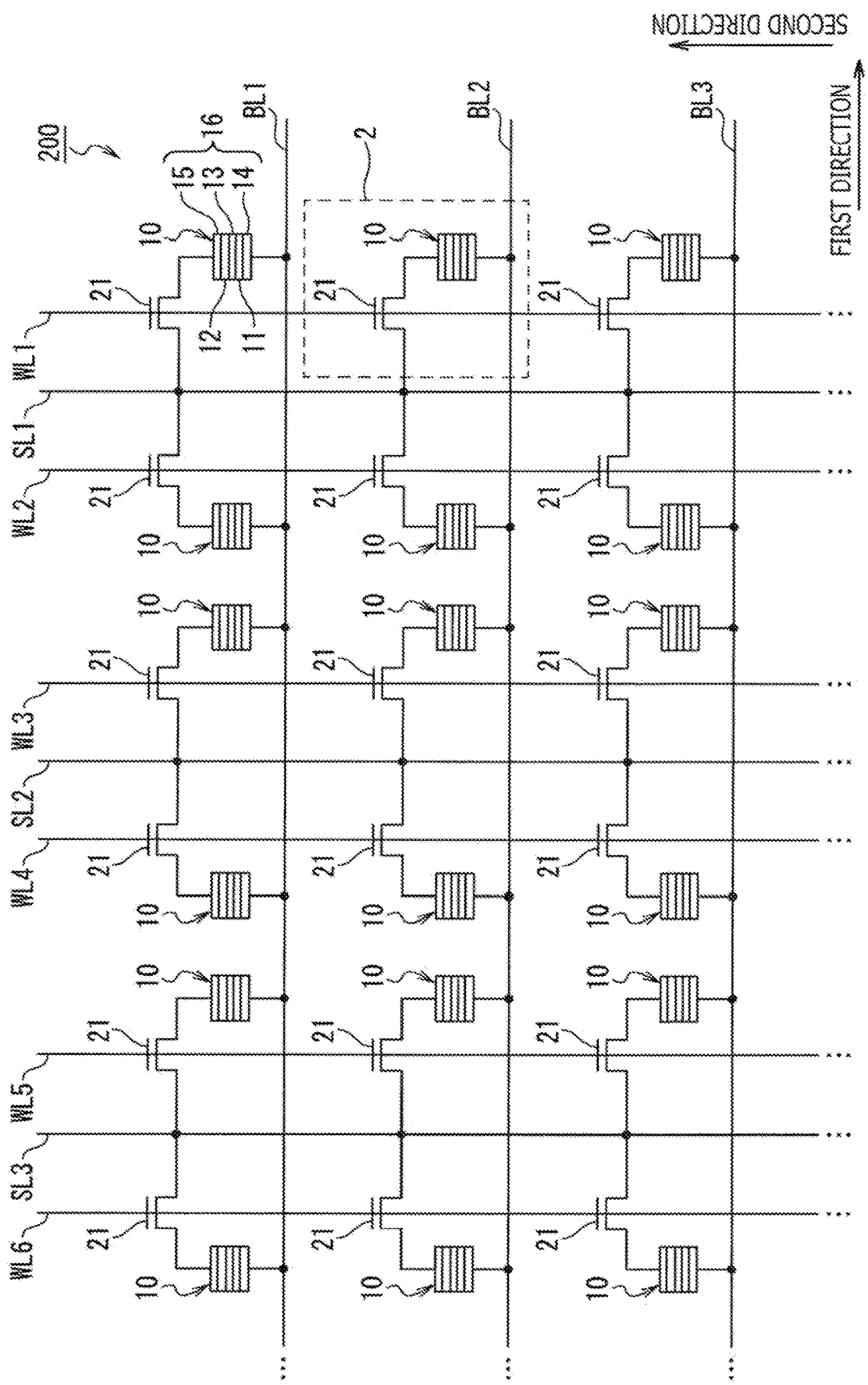
FIG. 11 is a diagram depicting an example of an array structure of a memory cell array according to a second embodiment.

FIG. 11 is a diagram depicting an example of an array structure of a memory cell array according to the second embodiment.

As depicted in FIG. 11, the semiconductor device 1B according to the second embodiment includes a memory cell array 200 having a structure where the memory cells 2 each included in the semiconductor device 1 of the first embodiment described above are provided in an array arrangement.

As depicted in FIG. 11, the memory cell array 200 includes a plurality of word lines WL1, WL2, WL3, WL4, WL5, WL6, and up to WLn (n: 2 or larger even number in the second embodiment). The word lines WL1 to WLn are arranged in a first direction in FIG. 11 and extend in a second direction in FIG. 11. The memory cell array 200 further includes a plurality of bit lines BL1, BL2, BL3, and up to BLm (m: natural number) arranged in a direction (second direction) perpendicular to the plurality of word lines WL1 to WLn, and extending in the first direction. The memory cell array 200 further includes a plurality of memory cells 2 disposed at respective intersections of the plurality of word lines WL1 to WLn with the plurality of bit lines BL1 to BLm one memory cell for each intersection. The word lines WL1 to WLn will be hereinafter simply referred to as "word lines WL" in a case where no distinction between these lines is needed. Similarly, the bit lines BL1 to BLm will be simply referred to as "bit lines BL" in a case where no distinction between these lines is needed.

The memory cell array 200 further includes a plurality of source lines SL1, SL2, SL3, and up to SLk (k: four or more natural number). The source lines SL1 to SLk are arranged one for each set of the two word lines successively disposed in the first direction in FIG. 11, i.e., WL1 and WL2, WL3 and WL4, WL 5 and WL6, and up to WL(n−1) and WLn, at a position between the two word lines WL and in parallel to the two word lines WL. The source lines SL1 to SLk will be hereinafter simply referred to as "source lines SL" in a case where no distinction between these lines is needed.

According to the memory cell array 200, the blow transistors 21 of the two memory cells 2, which are arranged in the extension direction of the bit lines BL for each set of the two word lines W with the source line SL interposed between the two memory cells 2, share the one source line SL disposed between the corresponding two blow transistors 21. In other words, the sources of the blow transistors 21 of the two memory cells 2 are connected to the common source line SL. For example, the blow transistors 21 of the two memory cells adjacent to each other in the first direction (hereinafter referred to as a "memory cell pair") share the source line SL1.

While not depicted in the figure, the semiconductor device 1B further includes a plurality of writing circuits 20B for writing information to the respective storage elements 10 of the memory cell array 200. Moreover, while not depicted in the figure, the semiconductor device 1B further includes a plurality of the reading circuits 30 for reading information from the respective storage elements 10, the reference signal generation circuit 40, the comparator 50, and the control circuit 60 controlling operations of the respective circuits.

[Configuration of Memory Cell Array 200]

Figure 12:
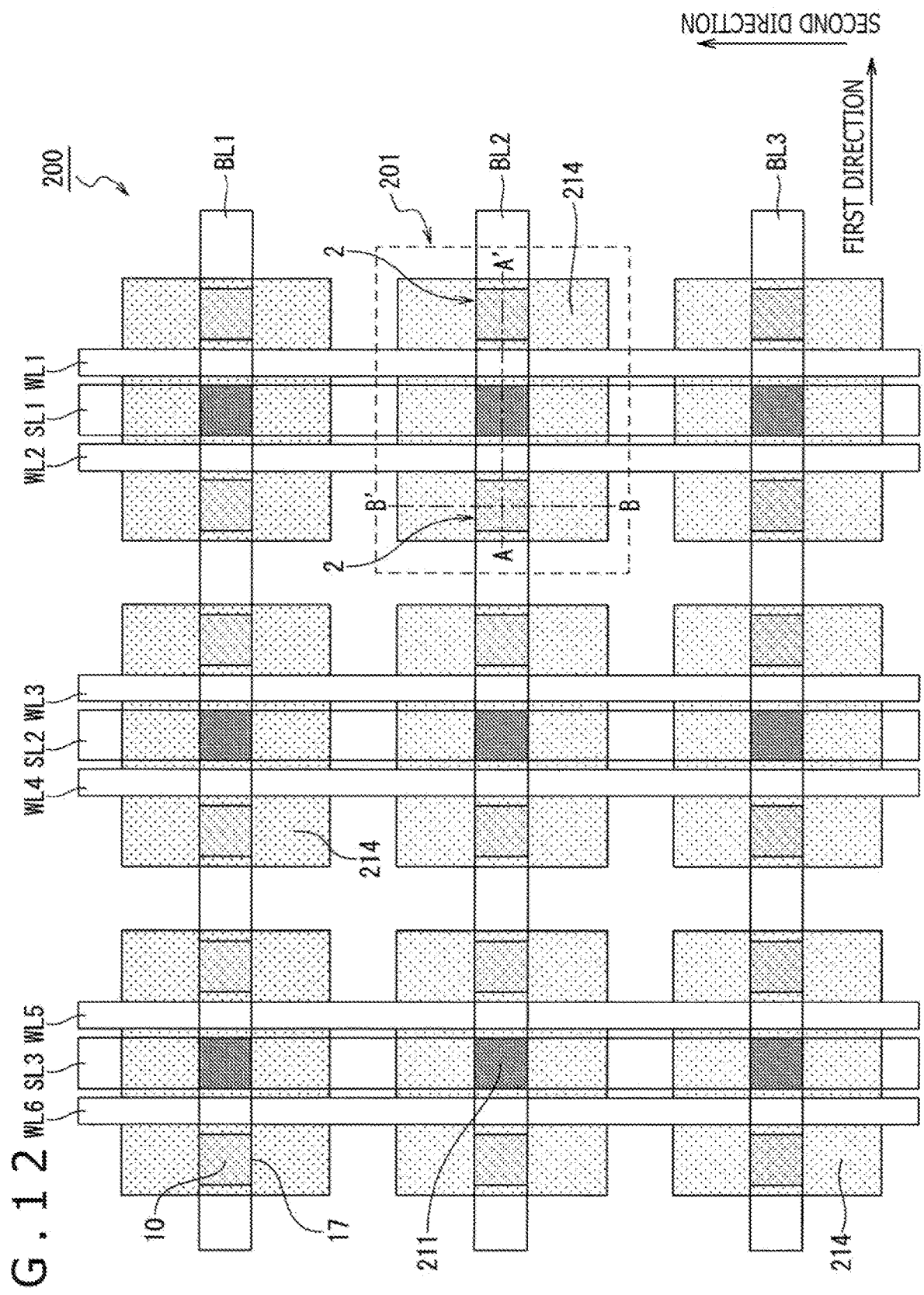
FIG. 12 is a plan diagram depicting an example of a layout configuration of the memory cell array according to the second embodiment.

FIG. 12 is a plan diagram depicting an example of a layout configuration of the memory cell array according to the second embodiment. Note that FIG. 12 depicts only the word lines WL1 to WL6, the source lines SL1 to SL3, the bit lines BL1 to BL3, and memory cell pairs 201 corresponding to these lines.

As depicted in FIG. 12, according to the memory cell array 200 of the second embodiment, a plurality of element regions (also referred to as active regions) 214 are arranged in the first direction (row direction) and the second direction (column direction) at equal intervals. Moreover, the two word lines WL (WL1 and WL2, WL3 and WL4, or WL5 and WL6 in the example of FIG. 12) are so arranged as to extend in the second direction for each column of the plurality of element regions 214 arranged in the second direction (for each set of the three element regions 214 arranged in the second direction in the example of FIG. 12). Furthermore, the one bit line BL (BL1, BL2, or BL3 in the example of FIG. 12) is so arranged as to extend in the first direction for each row of the plurality of element regions 214 arranged in the first direction (for each set of the three element regions 214 arranged in the first direction in the example of FIG. 12).

Note that the one source line SL (SL1, SL2, or SL3 in the example of FIG. 12) is also so disposed as to extend in the second direction between each set of the two word lines WL1 and WL2, WL3 and WL4, and WL5 and WL6 and in parallel to the two word lines WL. Accordingly, the two memory cells 2 adjacent to each other in the first direction share the one common source line SL in the memory cell pair 201 associated with the corresponding element regions 214.

Moreover, a contact 211 is a contact for connecting source terminals of the two blow transistors 21 of each of the memory cell pairs 201 to the one common source line SL. On the other hand, the storage element 10 connected to the drain terminal side of each of the blow transistors 21 is provided between the drain terminal and the bit line BL, and is connected to the bit line BL via a contact 18 (described below) formed on the metal wire 17.

[Configuration of Memory Cell Pair 201]

Figure 13:
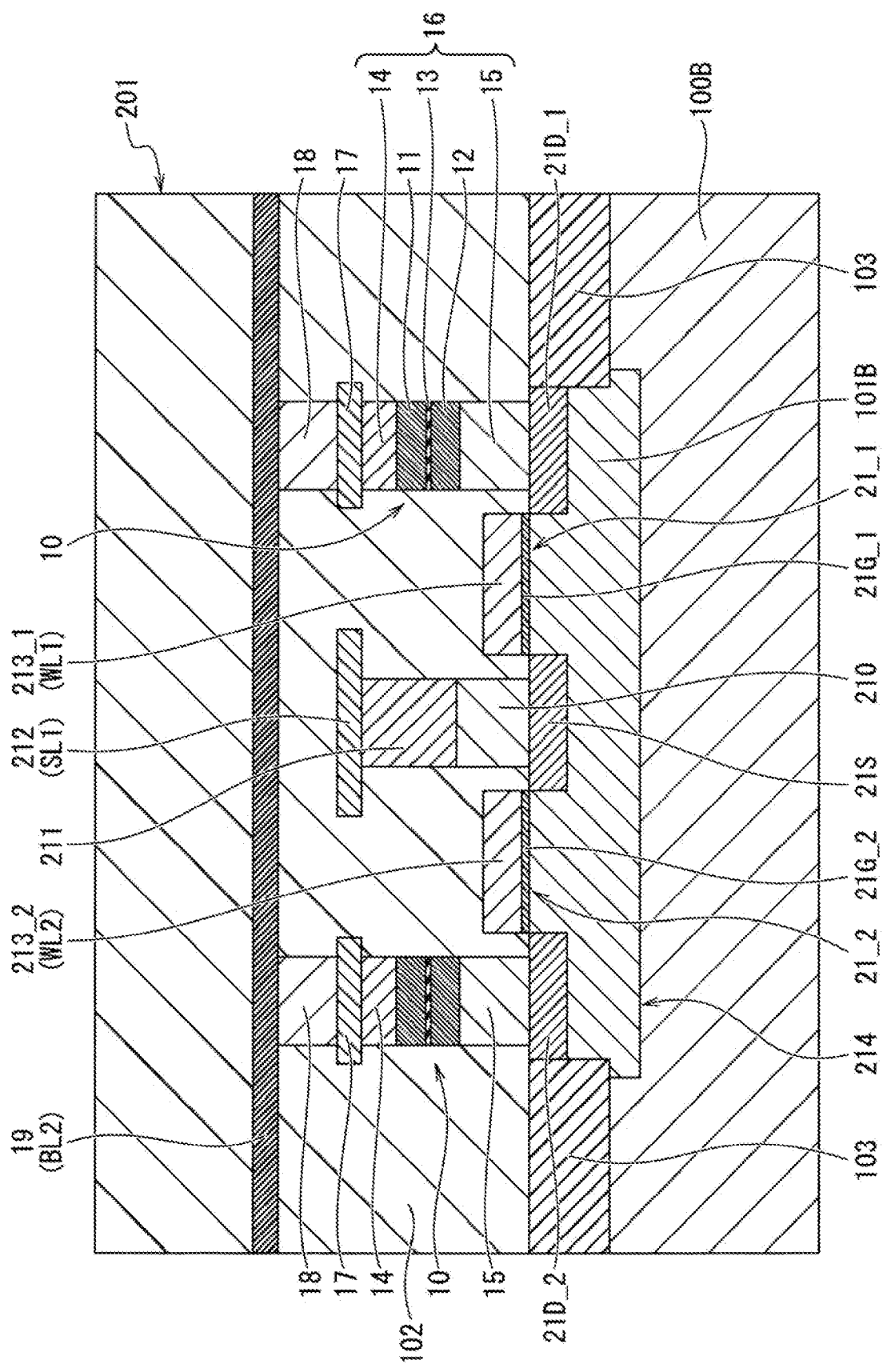
FIG. 13 is a cross-sectional diagram taken along a line A-A' in FIG. 12.
Figure 14:
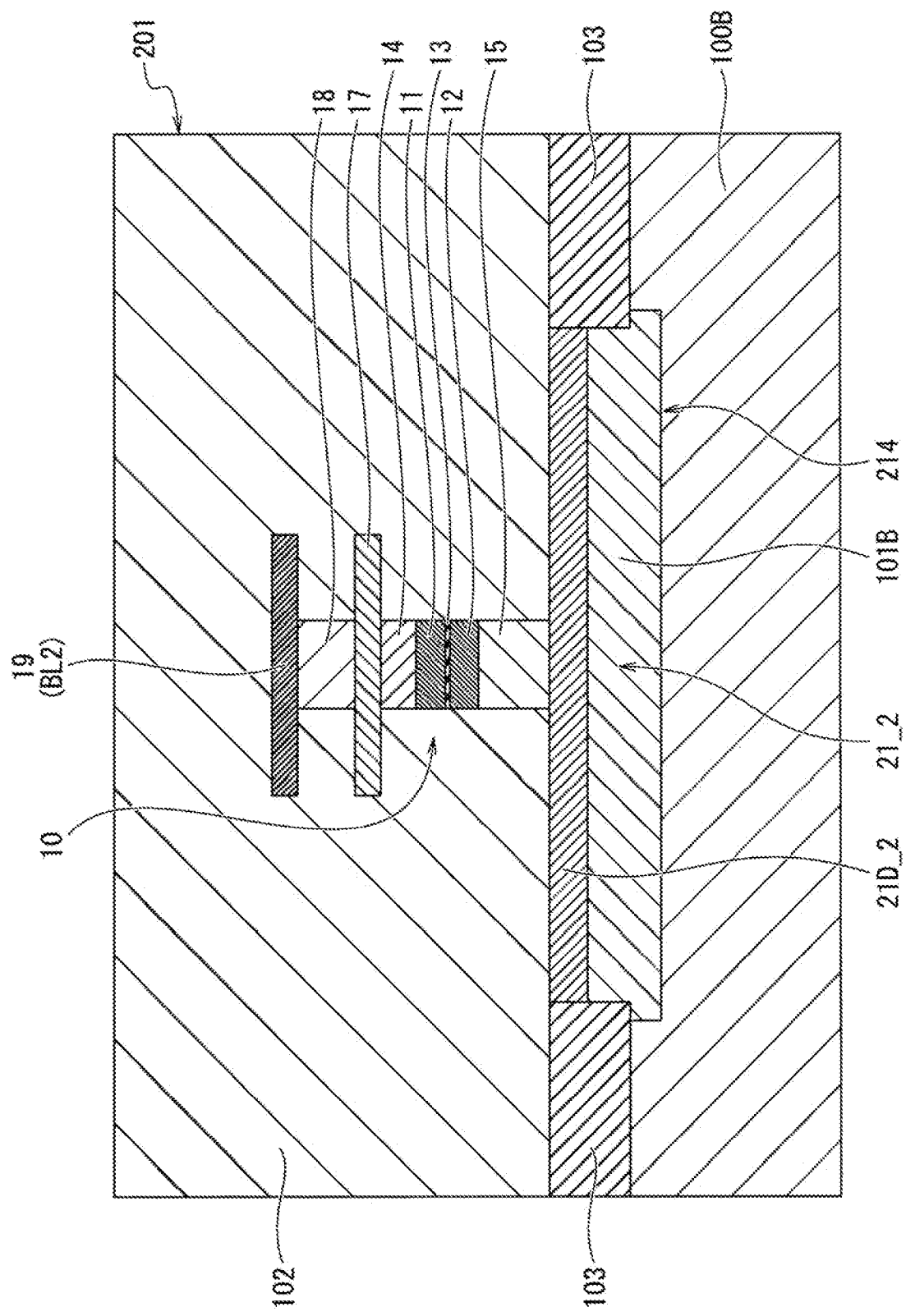
FIG. 14 is a cross-sectional diagram taken along a line B-B' in FIG. 12.

FIG. 13 is a cross-sectional diagram taken along a line A-A' in FIG. 12, while FIG. 14 is a cross-sectional diagram taken along a line B-B' in FIG. 12. Note that FIG. 13 depicts a cross-sectional diagram of the memory cell 201 surrounded by a broken line in FIG. 12 as a representative, and is applicable to configurations of other memory cell pairs.

As depicted in FIG. 13, the memory cell pair 201 is formed on a semiconductor substrate 100B which is a P-type silicon substrate. A region where an element separation region 103 is not provided in a surface region of the semiconductor substrate 100B corresponds to the element region 214. A P-type well region 101B is formed in the element region 214. Two blow transistors 21_1 and 21_2 are provided in the well region 101B. Specifically, two drain regions 21D_1 and 21D_2, two gate electrodes 21G_1 and 21G_2, and one source region 21S are provided in the well region 101B. Note that each of the gate electrodes 21G_1 and 21G_2 is provided on the well region 101B between the drain regions 21D_1 and 21D_2 with a gate insulation film (not depicted) interposed between the well region 101B and the gate electrodes 21G_1 and 21G_2. Moreover, the source region 21S is provided at a portion of the well region 101B between the gate electrodes 21G_1 and 21G_2.

In addition, the blow transistor 21_1 is constituted by the gate insulation film, the gate electrode 21G_1, the drain region 21D_1, and the source region 21S. Moreover, the blow transistor 21_2 is constituted by the gate insulation film, the gate electrode 21G_2, the drain region 21D_2, and the source region 21S. Accordingly, the blow transistors 21_1 and 21_2 share the one source region 21S.

A metal wire 213_1, which constitutes the word line WL1 in the example of FIG. 13, is disposed on the gate electrode 21G_1 with the interlayer dielectric 102 interposed between the gate electrode 21G_1 and the metal wire 213_1. Moreover, a metal wire 213_2, which constitutes the word line WL2 in the example of FIG. 13, is disposed on the gate electrode 21G_2 with the interlayer dielectric 102 interposed between the gate electrode 21G_2 and the metal wire 213_2.

The contacts 210 and 211 and the metal wire 212 are disposed on the source region 21S with the interlayer dielectric 102 interposed between the source region 21S, and the contacts 210 and 211 and the metal wire 212. Specifically, the contact 210 is formed on the source region 21S. The contact 211 is formed on the contact 210. The metal wire 212, which constitutes the source line SL1 in the example of FIG. 13, is formed on the contact 211.

Moreover, as depicted in FIGS. 13 and 14, the storage element 10 is disposed on each of the drain regions 21D_1 and 21D_2 with the interlayer dielectric 102 interposed between the storage element 10 and the drain regions 21D_1 and 21D_2. The configuration of the storage elements 10 is similar to that of the first embodiment described above. Furthermore, the metal wire 17, the contact 18, and the metal wire 19 are disposed on the upper electrode 14 of each of the storage elements 10 with the interlayer dielectric 102 interposed between the upper electrode 14 and the metal wire 17, the contact 18, and the metal wire 19. Specifically, the metal wire 17 is provided on the upper electrode 14, and the contact 18 is provided on the metal wire 17. In addition, the metal wire 19, which constitutes the bit line BL2 in the example depicted in FIG. 13, is provided on the contact 18.

The contact 18 described above is herein constituted by Ta, Al, Cu, W, or the like, for example. The contact 18 in one example is constituted by W, for example. In addition, the metal wire 19 described above is constituted by Cu or Au, for example. The metal wire 19 in one example is constituted by Cu, for example. Moreover, the element separation region 103 is constituted by an element separation region having an STI (Shallow Trench Isolation) structure, for example.

[Configuration of Semiconductor Device 1B of Second Embodiment]

Figure 15:
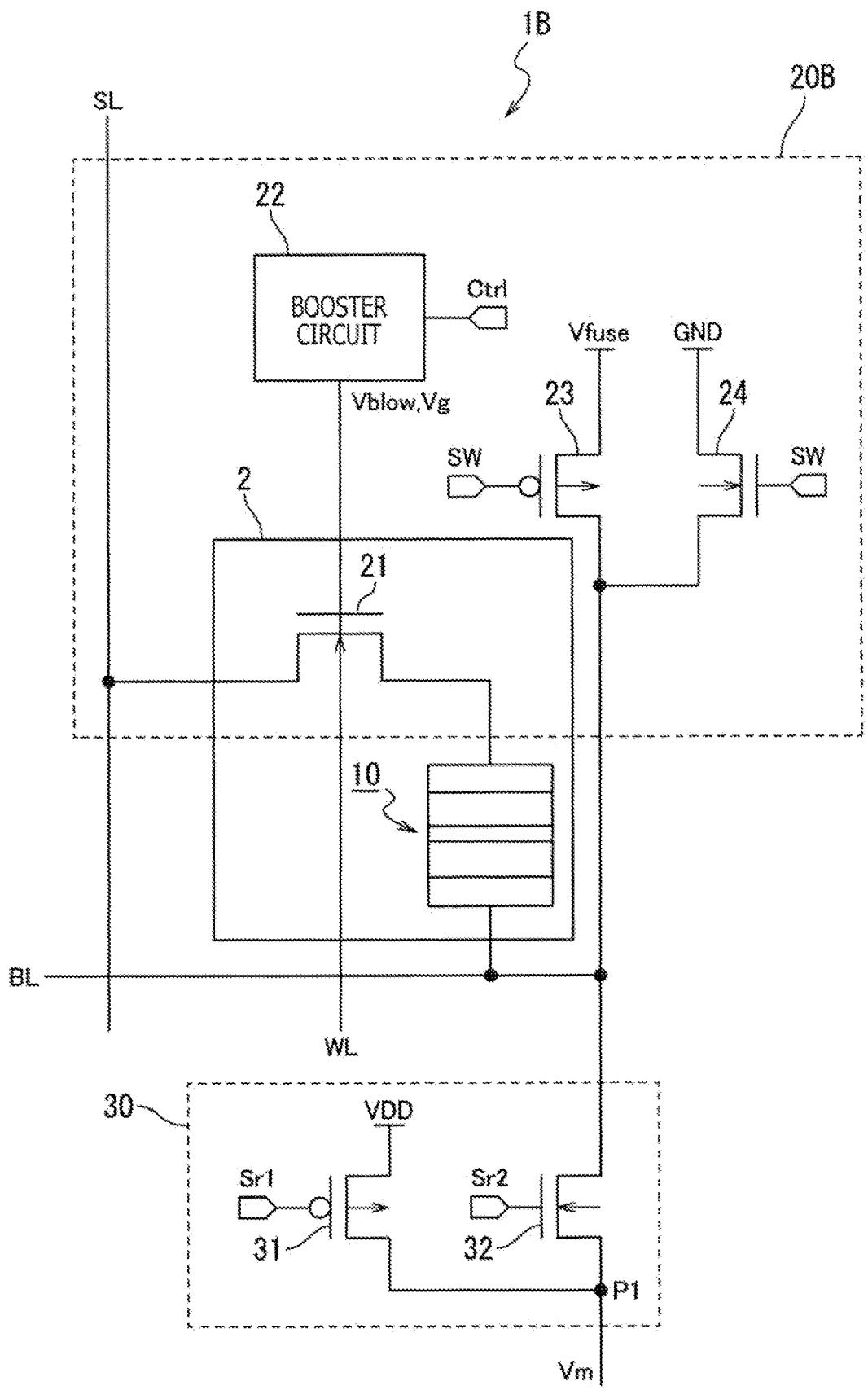
FIG. 15 is a diagram depicting a circuit configuration example of a part of a semiconductor device according to the second embodiment.

FIG. 15 herein is a diagram depicting a circuit configuration example of the semiconductor device according to the second embodiment.

As depicted in FIG. 15, according to the writing circuit 20 of the semiconductor device 1B of the second embodiment, the gate terminal of the blow transistor 21 constituting the corresponding memory cell 2 is connected to the word line WL, while the source terminal of the blow transistor 21 is connected to the source line SL. In addition, the drain terminal of the blow transistor 21 is connected to the lower electrode 15 of the storage element 10 constituting the corresponding memory cell 2, while the upper electrode 14 of the storage element 10 is connected to the bit line BL.

The drain terminals of the first and second writing switch elements 23 and 24 constituting the writing circuit 20, and the source terminal of the second reading switch element 32 constituting the reading circuit 30 are connected to the bit line BL.

Accordingly, the blow voltage Vblow is applied to the gate electrode 21G of the blow transistor 21 via the word line WL, and the power source Vfuse is connected (writing voltage Vfuse is applied) to the upper electrode 14 of the storage element 10 and the source terminal of the second reading switch element 32 via the bit line BL. Moreover, the source terminal of the blow transistor 21 is connected to the ground potential (GND) via the source line SL.

[Information Writing Operation to Storage Element 10 of Second Embodiment]

A basic operation of the writing circuit 20B according to the second embodiment is similar to the writing circuit 20 of the first embodiment described above. However, while the blow transistor 21 constituting the writing circuit 20B is provided for each of the memory cells 2, the booster circuit 22 is provided for each of the word lines WL, for example. In addition, the first and second writing switch elements 23 and 24 are provided for each of the bit lines BL, for example. Moreover, the plurality of memory cells 2 are disposed in an array arrangement and connected to the word lines WL, the bit lines BL, and the source lines SL as common lines. Accordingly, information needs to be written to only the memory cell 2 corresponding to a selected writing target.

Figure 16:
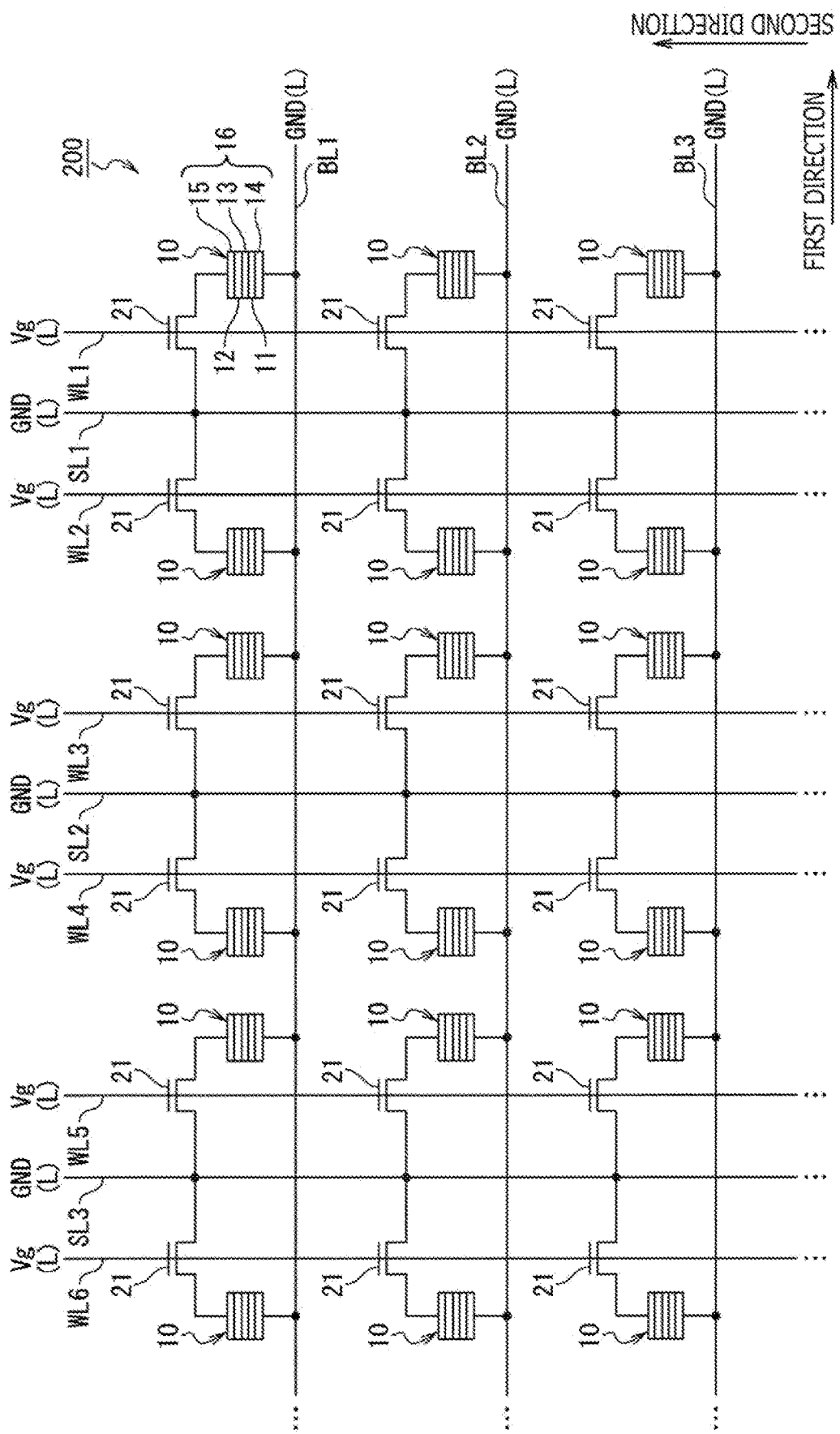
FIG. 16 is a diagram depicting a state of a memory cell array prior to information writing to a memory cell corresponding to a writing target.

FIG. 16 is a diagram depicting a state of the memory cell array prior to selection of the writing target memory cell, while FIG. 17 is a diagram depicting a state of the memory cell array after selection of the writing target memory cell.

As depicted in FIG. 16, in the state where the memory cell 2 corresponding to the writing target is not selected, a low-level signal Vg is applied to the word lines WL1 to WLn, and the bit lines BL1 to BLm are connected to the ground potential (GND). Moreover, the source lines SL1 to SLk are constantly connected to the ground potential. Accordingly, the low-level signal Vg is applied to the gate electrode 21G of the blow transistor 21 of each of the memory cells 2, and the ground potential is connected to the upper electrode 14 of the storage element 10 of each of the memory cells 2. In addition, the ground potential is connected to the source terminal of the blow transistor 21 of each of the memory cells 2.

On the other hand, as depicted in FIG. 17, it is assumed that a high-level blow voltage Vblow is applied to the word line WL1, and that a high-level power source voltage Vfuse is applied to the bit line BL2. In this case, the high-level blow voltage Vblow is applied to the gate electrodes 21G of the blow transistors 21 of all the memory cells 2 connected to the word line WL1. In addition, the power source Vfuse is connected to the upper electrodes 14 of all the storage elements 10 connected to the bit line BL2. In other words, the blow voltage Vblow is applied to the gate electrodes 21G of the blow transistors 21 of only the memory cells 2 connected to both the word line WL1 and the bit line BL2, and the power source voltage Vfuse is applied to the upper electrodes 14 of the corresponding storage elements 10. Accordingly, as indicated by an arrow in FIG. 17, the blow current Iblow flows only in the storage elements 10 of the corresponding memory cells 2, and achieves information writing.

Operations and Effects of Second Embodiment

The semiconductor device 1B according to the second embodiment includes the plurality of word lines WL1 to WLn, the plurality of bit lines BL1 to BLm arranged in directions perpendicular to the plurality of word lines WL1 to WLn, the memory cells 2 disposed at the respective intersections of the plurality of word lines WL1 to WLn with the plurality of bit lines BL1 to BLm one memory cell for each intersection, and the writing circuit 20B. Each of the memory cells 2 includes the storage element 10 and the blow transistor 21. The writing circuit 20B produces at least three identifiable resistance states (first to third states) by applying the blow current Iblow to the storage element 10 via the blow transistor 21. The semiconductor device 1B further includes the plurality of source lines SL1 to SLk each of which is arranged between the two word lines WL successively located in the extension directions of the bit lines BL1 to BLk, and is disposed in parallel to the corresponding word lines WL. The source terminals of the blow transistors 21 of the respective memory cells 2 arranged in the extension direction of the two word lines WL are connected to the one common source line SL sandwiched between the two word lines WL.

Furthermore, the reading circuit 30 reads a signal associated with a resistance value of the storage element 10, and the reference signal generation circuit 40 generates a reference signal (threshold signal) for discriminating at least three identifiable resistance states. The comparator 50 compares the reference signal generated by the reference signal generation circuit 40 and the signal associated with the resistance value read by the reading circuit 30 to discriminate the at least three resistance states.

Besides, the storage element 10 is constituted by a magnetic tunnel junction element (MTJ element) which includes the fixed magnetization layer 12, the upper electrode 14 provided on the fixed magnetization layer 12, the storage layer 11, the lower electrode 15 provided on the storage layer 11, and the tunnel barrier layer 13 provided between the fixed magnetization layer 12 and the storage layer 11. Accordingly, the filament 16 includes the upper electrode 14, the lower electrode 15, and the tunnel barrier layer 13, and obtains the at least three identifiable resistance states by changing a combination of the resistance states of these.

Moreover, the semiconductor device 1B is configured to produce the at least three identifiable resistance states constituted by the first state corresponding to an initial state prior to application of the blow current Iblow, the second state after damaging the tunnel barrier layer 13 by application of the blow current Iblow, and the third state produced after damaging the upper electrode 14 and the lower electrode 15 by application of the blow current Iblow.

Note that the second state is a low resistance state corresponding to a resistance lower than that of the first state, while the third state is a high resistance state corresponding to a resistance higher than the first state.

Moreover, the blow conditions of the filament 16 are established to produce the first to third states described above. Specifically, the first blow condition is set as a condition for applying the first blow voltage Vblow 1 to the gate electrode 21G of the blow transistor 21 for the first blow time Tblow1. Moreover, the second blow condition is set as a condition for applying the second blow voltage Vblow2 higher than the first blow voltage Vblow1 to the gate electrode 21G for the second blow time Tblow2 longer than the first blow time Tblow1. Furthermore, the third blow condition is set as a condition for maintaining the first state without applying the first blow voltage Vblow to the gate electrode 21G.

This configuration achieves operations and effects similar to those of the first embodiment described above. Moreover, the two memory cells 2 connected to the adjoining word lines WL in the plurality of memory cells 2 constituting the memory cell array 200 are allowed to share the source region. In this case, the area for mounting the plurality of blow transistors 21 constituting the memory cell array 200 can be more reduced than a conventional area. Accordingly, the area for mounting the memory cell array 200 can be more reduced than a conventional area.

Moreover, multiple value information recording thus achieved can reduce areas of peripheral circuits such as a decoder.

Furthermore, the semiconductor device 1B can be manufactured by processes similar to conventional processes. Accordingly, the necessity of changing processes or adding new processes is eliminated. A cost increase produced by a process change is therefore avoidable.

In addition, the semiconductor device 1B according to the second embodiment further sets, for the first blow condition and the second blow condition, such a condition where the flow direction of the blow current Iblow is one direction from the upper electrode 14 to the lower electrode 15.

According to this configuration, the blow current Iblow flows in one direction from the upper electrode 14 to the lower electrode 15, or from the lower electrode 15 to the upper electrode 14. Accordingly, the source region of the blow transistor 21 can be fixed to the ground potential as described above. Accordingly, the adjoining memory cells are allowed to share the source line SL, and therefore simplification of a circuit configuration is achievable. As a result, a layout area can be reduced.

<Application Example to Electronic Apparatus>

The technology according to the present disclosure (present technology) is applicable to various products. For example, the technology according to the present disclosure is applicable to various types of electronic apparatuses such as an imaging device including a digital still camera and a digital video camera, a cellular phone, or other devices each equipped with an OTP memory.

FIG. 18 is a block diagram depicting a configuration example of an imaging device as an electronic apparatus to which the present technology is applicable. An imaging device 301 depicted in FIG. 18 is constituted by an optical system 302, a shutter device 303, a solid-state imaging element 304, a control circuit 305, a signal processing circuit 306, a monitor 307, and a non-volatile memory 308, and is capable of capturing a still image and a moving image.

The optical system 302 is constituted by one or a plurality of lenses, and configured to guide light (incident light) from an object toward the solid-state imaging element 304, and form an image of the light on a light receiving surface of the solid-state imaging element 304.

The shutter device 303 is disposed between the optical system 302 and the solid-state imaging element 304, and controls a light irradiation period and a light block period for the solid-state imaging element 304 under control by the control circuit 305.

The solid-state imaging element 304 accumulates signal charges for a fixed period according to the light of the image formed on the light receiving surface by using the optical system 302 and the shutter device 303. The signal charges accumulated in the solid-state imaging element 304 are transferred according to a driving signal (timing signal) supplied from the control circuit 305.

The solid-state imaging element 304 further includes an OTP memory 309. For example, the OTP memory 309 is used for defect correction of pixels, storage of data for image quality correction such as adjustment of a sensor driving parameter, and other purposes. Moreover, for example, the OTP memory 309 is used for lens shading correction, storage of data for Auto Focus parameter input, storage of individual identification information, and other purposes as individual adjustment of the lens module.

The control circuit 305 outputs driving signals for controlling a transfer operation of the solid-state imaging element 304 and a shutter operation of the shutter device 303 to drive the solid-state imaging element 304 and the shutter device 303.

The signal processing circuit 306 performs various types of signal processing for signal charges output from the solid-state imaging element 304. An image (image data) obtained by performing the signal processing using the signal processing circuit 306 is supplied to and displayed on the monitor 307, or supplied to and stored (recorded) in the non-volatile memory 308.

The imaging device 301 thus configured is also capable of reducing a layout area of the OTP memory by adopting the semiconductor device 1, 1A, or 1B instead of the OTP memory 309 described above. Moreover, information rewriting is also achievable in a case where a more preferable parameter is found later, for example.

Other Embodiments

While the embodiments and the modifications have been described above to explain the present disclosure, it should not be understood that the description and the drawings constituting a part of this disclosure limit the present disclosure. Various alternative embodiments, practical examples, and operation technologies will become apparent for those skilled in the art in the light of this disclosure.

For example, the upper electrode 14 and the lower electrode 15 of the embodiments described above are not necessarily required to be constituted by the same material. For example, the materials constituting the upper electrode 14 and the lower electrode 15 may be materials having different current resistance levels. This configuration allows a separate blow to each of the upper electrode 14 and the lower electrode 15, and therefore achieves four-value recording.

Moreover, for example, the memory cell of the embodiments described above is not necessarily required to be constituted by a magneto-resistance change memory. For example, the memory cell may be constituted by a ferroelectric memory, a phase change memory, a resistance change memory, or the like if conditions are met.

As apparent from above, needless to say, the present disclosure includes various embodiments and the like not described herein. At least one of various types of omissions, replacements, and changes of constituent elements may be made without departing from the subject matters of the embodiments and the modifications described above. Moreover, advantageous effects of the present description are presented only by way of example. Other advantageous effects may be further offered. The technical scope of the present disclosure is defined only by the matters specifying the invention and described in the claims as reasonable matters based on the above description.

Note that the present disclosure may have following configurations.

(1) A semiconductor device including:
a storage element including a filament that has a first conductive layer, a second conductive layer, and an insulation layer, the first conductive layer and the second conductive layer being stacked with at least the insulation layer interposed between the first conductive layer and the second conductive layer, the filament obtaining at least three identifiable resistance states by changing a combination of a state of the first conductive layer, a state of the second conductive layer, and a state of the insulation layer; and
a writing unit that produces the at least three identifiable resistance states by applying a blow current to the storage element.

(2) The semiconductor device according to (1) described above, in which the storage element includes a magnetic tunnel junction element that includes a fixed magnetization layer, a first electrode formed on the fixed magnetization layer and functioning as the first conductive layer, a storage layer, a second electrode formed on the storage layer and functioning as the second conductive layer, and a tunnel barrier layer formed between the fixed magnetization layer and the storage layer and functioning as the insulation layer.

(3) The semiconductor device according to (1) or (2) described above, in which the at least three identifiable resistance states of the filament include an initial state, a low resistance state that is a lower resistance state than the initial state, and a high resistance state that is a higher resistance state than the initial state.

(4) The semiconductor device according to (3) described above, in which
the low resistance state includes a state where the insulation layer has been damaged, and
the high resistance state includes a state where at least either the first conductive layer or the second conductive layer has been damaged.

(5) The semiconductor device according to any one of (1) to (4) described above, in which the at least three resistance states of the filament change according to a blow condition of the filament.

(6) The semiconductor device according to (5) described above, in which the blow condition of the filament includes a unidirectional flow of a blow current from the first conductive layer to the second conductive layer of the filament.

(7) The semiconductor device according to any one of (1) to (6) described above, further including:
a reading unit that reads a signal associated with a resistance value of the storage element;
a threshold signal generation unit that generates a threshold signal for discriminating the at least three identifiable resistance states; and
a discrimination unit that discriminates the at least three resistance states by comparing the threshold signal generated by the threshold signal generation unit and the signal associated with the resistance value and read by the reading unit.

(8) A semiconductor device including:
a plurality of word lines;
a plurality of bit lines arranged in directions perpendicular to the plurality of word lines;
memory cells arranged at respective intersections of the plurality of word lines with the plurality of bit lines one memory cell for each intersection,
each of the memory cells including
a storage element including a filament that has a first conductive layer, a second conductive layer, and an insulation layer, the first conductive layer and the second conductive layer being stacked with at least the insulation layer interposed between the first conductive layer and the second conductive layer, the filament obtaining at least three identifiable resistance states by changing a combination of a state of the first conductive layer, a state of the second conductive layer, and a state of the insulation layer, and
a transistor for blow that has a gate terminal connected to the corresponding word line and a drain terminal connected to the corresponding bit line; and
a writing unit that produces the at least three identifiable resistance states by applying a blow current to the filament by using the transistor.

(9) The semiconductor device according to (8) described above, further including:
a plurality of source lines each of which is arranged between the two word lines successively located in extension directions of the bit lines and is disposed in parallel to the corresponding word lines, in which
source terminals of the transistors of the respective memory cells arranged in the extension directions of the two word lines are connected to the one common source line sandwiched between the two word lines.

(10) The semiconductor device according to (8) or (9) described above, in which the storage element includes a magnetic tunnel junction element that includes a fixed magnetization layer, a first electrode formed on the fixed magnetization layer and functioning as the first conductive layer, a storage layer, a second electrode formed on the storage layer and functioning as the second conductive layer, and a tunnel barrier layer formed between the fixed magnetization layer and the storage layer and functioning as the insulation layer.

(11) The semiconductor device according to any one of (8) to (10) described above, in which the at least three identifiable resistance states of the filament include an initial state, a low resistance state that is a lower resistance state than the initial state, and a high resistance state that is a higher resistance state than the initial state.

(12) The semiconductor device according to (11) described above, in which
the low resistance state includes a state where the insulation layer has been damaged, and
the high resistance state includes a state where at least either the first conductive layer or the second conductive layer has been damaged.

(13) The semiconductor device according to any one of (8) to (12) described above, in which the at least three identifiable resistance states of the filament change according to a blow condition of the filament.

(14) The semiconductor device according to (13) described above, in which the blow condition of the filament includes a unidirectional flow of a blow current from the first conductive layer to the second conductive layer of the filament.

(15) The semiconductor device according to any one of (8) to (14) described above, further including:
a reading unit that reads a signal associated with a resistance value of the storage element;
a threshold signal generation unit that generates a threshold signal for discriminating the at least three identifiable resistance states; and
a discrimination unit that discriminates the resistance states by comparing the threshold signal generated by the threshold signal generation unit and the signal associated with the resistance value and read by the reading unit.

(16) An electronic apparatus including:
a semiconductor device that includes
a storage element including a filament that has a first conductive layer, a second conductive layer, and an insulation layer, the first conductive layer and the second conductive layer being stacked with at least the insulation layer interposed between the first conductive layer and the second conductive layer, the filament obtaining at least three identifiable resistance states by changing a combination of a state of the first conductive layer, a state of the second conductive layer, and a state of the insulation layer, and
a writing unit that produces the at least three identifiable resistance states by applying a blow current to the storage element.

(17) An electronic apparatus including:
a semiconductor device that includes
a plurality of word lines,
a plurality of bit lines arranged in directions perpendicular to the plurality of word lines,
memory cells arranged at respective intersections of the plurality of word lines with the plurality of bit lines one memory cell for each intersection, each of the memory cells including
a storage element including a filament that has a first conductive layer, a second conductive layer, and an insulation layer, the first conductive layer and the second conductive layer being stacked with at least the insulation layer interposed between the first conductive layer and the second conductive layer, the filament obtaining at least three identifiable resistance states by changing a combination of a state of the first conductive layer, a state of the second conductive layer, and a state of the insulation layer, and
a transistor for blow that has a gate terminal connected to the corresponding word line and a drain terminal connected to the corresponding bit line, and
a writing unit that produces the at least three identifiable resistance states by applying a blow current to the filament by using the transistor.

REFERENCE SIGNS LIST 1, 1A, 1B: Semiconductor device
2: Memory cell
10: Storage element
11: Storage layer
12: Fixed magnetization layer
13: Tunnel barrier layer
14: Upper electrode
15: Lower electrode
16: Filament
17, 19, 212, 213, 213_1, 213_2: Metal wire
18, 210, 211: Contact
20, 20A, 20B: Writing circuit
21, 21_1, 21_2: Blow transistor
21D, 21D_1, 21D_2: Drain region
21G, 21G_1, 21G_2: Gate electrode
21S: Source region
22, 26: Booster circuit
23: First writing switch element
24: Second writing switch element
27: Third writing switch element
28: Fourth writing switch element
30: Reading circuit
31: First reading switch element
32: Second reading switch element
40: Reference signal generation circuit
41 to 44: First to fourth switch element
45: First reference resistor
46: Second reference resistor
50: Comparator
60, 60A, 60B: Control circuit
100, 100B: Semiconductor substrate 101, 101B: Well region
102: Interlayer dielectric
103: Element separation region
200: Memory cell array
201: Memory cell pair
214: Element region
301: Imaging device
302: Optical system
303: Shutter device
304: Solid-state imaging element
305: Control circuit
306: Signal processing circuit
307: Monitor
308: Non-volatile memory
309: OTP memory
WL1 to WLn: Word line
BL1 to BLm: Bit line
SL1 to SLk: Source line
Vblow, Vblow1, Vblow2: Blow voltage
Iblow, Iblow1, Iblow2: Blow current
Tblow, Tblow1, Tblow2: Blow time
Vfuse: Writing voltage
Rth1: First threshold
Rth2: Second threshold
Ctrl, SW, Sr1 to Sr6: Control signal

The invention claimed is:

1. A semiconductor device comprising:
a storage element including a filament that has a first conductive layer, a second conductive layer, and an insulation layer, the first conductive layer and the second conductive layer being stacked with at least the insulation layer interposed between the first conductive layer and the second conductive layer, the filament obtaining at least three identifiable resistance states by changing a combination of a state of the first conductive layer, a state of the second conductive layer, and a state of the insulation layer; and
a writing unit that produces the at least three identifiable resistance states by applying a blow current to the storage element, wherein
the at least three identifiable resistance states of the filament include an initial state, a low resistance state that is a lower resistance state than the initial state, and a high resistance state that is a higher resistance state than the initial state,
the low resistance state includes a state where the insulation layer has been damaged, and
the high resistance state includes a state where at least either the first conductive layer or the second conductive layer has been damaged.

2. The semiconductor device according to claim 1, wherein the storage element includes a magnetic tunnel junction element that includes a storage layer, a first electrode formed on the storage layer and functioning as the first conductive layer, a second electrode functioning as the second conductive layer, a fixed magnetization layer formed on the second electrode, and a tunnel barrier layer formed between the fixed magnetization layer and the storage layer and functioning as the insulation layer.

3. The semiconductor device according to claim 1, wherein the at least three resistance states of the filament change according to a blow condition of the filament.

4. The semiconductor device according to claim 3, wherein the blow condition of the filament includes a unidirectional flow of a blow current from the first conductive layer to the second conductive layer of the filament.

5. An electronic apparatus comprising the semiconductor device of claim 1.

6. A semiconductor device comprising:
a storage element including a filament that has a first conductive layer, a second conductive layer, and an insulation layer, the first conductive layer and the second conductive layer being stacked with at least the insulation layer interposed between the first conductive layer and the second conductive layer, the filament obtaining at least three identifiable resistance states by changing a combination of a state of the first conductive layer, a state of the second conductive layer, and a state of the insulation layer;
a writing unit that produces the at least three identifiable resistance states by applying a blow current to the storage element;
a reading unit that reads a signal associated with a resistance value of the storage element;
a threshold signal generation unit that generates a threshold signal for discriminating the at least three identifiable resistance states; and
a discrimination unit that discriminates the at least three resistance states by comparing the threshold signal generated by the threshold signal generation unit and the signal associated with the resistance value and read by the reading unit.

7. An electronic apparatus comprising the semiconductor device of claim 6.

8. A semiconductor device comprising:
a plurality of word lines;
a plurality of bit lines arranged in directions perpendicular to the plurality of word lines;
memory cells arranged at respective intersections of the plurality of word lines with the plurality of bit lines one memory cell for each intersection,
each of the memory cells including
a storage element including a filament that has a first conductive layer, a second conductive layer, and an insulation layer, the first conductive layer and the second conductive layer being stacked with at least the insulation layer interposed between the first conductive layer and the second conductive layer, the filament obtaining at least three identifiable resistance states by changing a combination of a state of the first conductive layer, a state of the second conductive layer, and a state of the insulation layer, and
a transistor for blow that has a gate terminal connected to the corresponding word line and a drain terminal connected to the corresponding bit line; and
a writing unit that produces the at least three identifiable resistance states by applying a blow current to the filament by using the transistor; and
a plurality of source lines each of which is arranged between the two word lines successively located in extension directions of the bit lines and is disposed in parallel to the corresponding word lines, wherein
source terminals of the transistors of the respective memory cells arranged in the extension directions of the two word lines are connected to the one common source line sandwiched between the two word lines.

9. The semiconductor device according to claim 8, wherein the storage element includes a magnetic tunnel junction element that includes a storage layer, a first electrode formed on the storage layer and functioning as the first conductive layer, a second electrode functioning as the second conductive layer, a fixed magnetization layer formed on the second electrode, and a tunnel barrier layer formed between the fixed magnetization layer and the storage layer and functioning as the insulation layer.

10. The semiconductor device according to claim 8, wherein the at least three identifiable resistance states of the filament change according to a blow condition of the filament.

11. The semiconductor device according to claim 10, wherein the blow condition of the filament includes a unidirectional flow of a blow current from the first conductive layer to the second conductive layer of the filament.

12. The semiconductor device according to claim 8, further comprising:
   a reading unit that reads a signal associated with a resistance value of the storage element;
   a threshold signal generation unit that generates a threshold signal for discriminating the at least three identifiable resistance states; and
   a discrimination unit that discriminates the resistance states by comparing the threshold signal generated by the threshold signal generation unit and the signal associated with the resistance value and read by the reading unit.

13. An electronic apparatus comprising the semiconductor device of claim 8.

14. An electronic apparatus comprising:
   a semiconductor device that includes
      a plurality of word lines,
      a plurality of bit lines arranged in directions perpendicular to the plurality of word lines,
      memory cells arranged at respective intersections of the plurality of word lines with the plurality of bit lines one memory cell for each intersection, each of the memory cells including
         a storage element including a filament that has a first conductive layer, a second conductive layer, and an insulation layer, the first conductive layer and the second conductive layer being stacked with at least the insulation layer interposed between the first conductive layer and the second conductive layer, the filament obtaining at least three identifiable resistance states by changing a combination of a state of the first conductive layer, a state of the second conductive layer, and a state of the insulation layer, and
         a transistor for blow that has a gate terminal connected to the corresponding word line and a drain terminal connected to the corresponding bit line, and
      a writing unit that produces the at least three identifiable resistance states by applying a blow current to the filament by using the transistor, wherein
   the at least three identifiable resistance states of the filament include an initial state, a low resistance state that is a lower resistance state than the initial state, and a high resistance state that is a higher resistance state than the initial state,
   the low resistance state includes a state where the insulation layer has been damaged, and
   the high resistance state includes a state where at least either the first conductive layer or the second conductive layer has been damaged.

15. The electronic apparatus according to claim 14, further comprising:
   a reading unit that reads a signal associated with a resistance value of the storage element;
   a threshold signal generation unit that generates a threshold signal for discriminating the at least three identifiable resistance states; and
   a discrimination unit that discriminates the resistance states by comparing the threshold signal generated by the threshold signal generation unit and the signal associated with the resistance value and read by the reading unit.

* * * * *